(12) United States Patent
Taniguchi et al.

(10) Patent No.: US 10,263,002 B2
(45) Date of Patent: Apr. 16, 2019

(54) ANTI-FUSE MEMORY AND SEMICONDUCTOR STORAGE DEVICE

(71) Applicant: Floadia Corporation, Kodaira-shi, Tokyo (JP)

(72) Inventors: Yasuhiro Taniguchi, Kodaira (JP); Hideo Kasai, Kodaira (JP); Yasuhiko Kawashima, Kodaira (JP); Ryotaro Sakurai, Kodaira (JP); Yutaka Shinagawa, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 15/521,768

(22) PCT Filed: Oct. 9, 2015

(86) PCT No.: PCT/JP2015/078732
§ 371 (c)(1),
(2) Date: Apr. 25, 2017

(87) PCT Pub. No.: WO2016/067895
PCT Pub. Date: May 6, 2016

(65) Prior Publication Data
US 2017/0250187 A1 Aug. 31, 2017

(30) Foreign Application Priority Data
Oct. 31, 2014 (JP) .................................. 2014-223793

(51) Int. Cl.
*H01L 27/112* (2006.01)
*H01L 23/525* (2006.01)
(Continued)

(52) U.S. Cl.
CPC ........ *H01L 27/11206* (2013.01); *G11C 17/06* (2013.01); *G11C 17/16* (2013.01);
(Continued)

(58) Field of Classification Search
CPC ............. H01L 23/5256; H01L 23/5252; H01L 27/11206; H01L 27/11226; H01L 29/4983;
(Continued)

(56) References Cited

U.S. PATENT DOCUMENTS 6,034,882 A 3/2000 Johnson et al.
6,667,902 B2 12/2003 Peng
(Continued)

FOREIGN PATENT DOCUMENTS

JP 2004-127500 4/2004
JP 2009-147003 A 7/2009
(Continued)

OTHER PUBLICATIONS

International Search Report and Written Opinion from Corresponding Application No. PCT/JP2015/078732; dated Nov. 11, 2015.
(Continued)

*Primary Examiner* — Marc Anthony Armand
*Assistant Examiner* — Nelson Garces
(74) *Attorney, Agent, or Firm* — Pearne & Gordon LLP

(57) ABSTRACT

In an anti-fuse memory includes a rectifier element of a semiconductor junction structure in which a voltage applied from a memory gate electrode to a word line is applied as a reverse bias in accordance with voltage values of the memory gate electrode and the word line, and does not use a conventional control circuit. Hence, the rectifier element blocks application of a voltage from the memory gate electrode to the word line. Therefore a conventional switch transistor that selectively applies a voltage to a memory (Continued)

capacitor and a conventional switch control circuit allowing the switch transistor to turn on or off are not necessary. Miniaturization of the anti-fuse memory and a semiconductor memory device are achieved correspondingly.

12 Claims, 9 Drawing Sheets

(51) Int. Cl.
| | | |
|---|---|---|
| *G11C 17/16* | (2006.01) | |
| *G11C 17/18* | (2006.01) | |
| *G11C 17/06* | (2006.01) | |
| *H01L 27/06* | (2006.01) | |
| *H01L 27/108* | (2006.01) | |
| *H01L 27/11502* | (2017.01) | |
| *H01L 27/11585* | (2017.01) | |

(52) U.S. Cl.
CPC .......... *G11C 17/18* (2013.01); *H01L 27/0629* (2013.01); *H01L 27/10805* (2013.01); *H01L 27/11502* (2013.01); *H01L 27/11585* (2013.01); *H01L 23/5252* (2013.01)

(58) Field of Classification Search
CPC .............. H01L 29/861; H01L 27/11502; H01L 27/10805; H01L 27/11585; H01L 27/0629; G11C 11/161; G11C 17/165; G11C 17/18; G11C 11/1673; G11C 11/1675; G11C 13/004; G11C 16/0483; G11C 16/10; G11C 16/3431; G11C 16/3495; G11C 2013/0054; G11C 17/16
USPC .................................................. 257/529–530
See application file for complete search history.

(56) References Cited

U.S. PATENT DOCUMENTS

| | | | |
|---|---|---|---|
| 8,248,833 B2 | 8/2012 | Koyama et al. | |
| 8,258,586 B1 | 9/2012 | Mitchell et al. | |
| 2004/0041167 A1 | 3/2004 | Marr et al. | |
| 2008/0212387 A1 | 9/2008 | Hoefler | |
| 2012/0051132 A1* | 3/2012 | Sandhu ............. | G11C 16/0416 365/185.05 |
| 2012/0147653 A1 | 6/2012 | Chung | |
| 2013/0033921 A1 | 2/2013 | Tsuda et al. | |
| 2013/0249017 A1 | 9/2013 | Kwon | |
| 2014/0183689 A1 | 7/2014 | Sung | |
| 2014/0239409 A1 | 8/2014 | Mitchell et al. | |

FOREIGN PATENT DOCUMENTS

| | | |
|---|---|---|
| JP | 2014-508421 A | 4/2014 |
| WO | 2009-044237 A1 | 4/2009 |

OTHER PUBLICATIONS

Partial Supplementary European Search Report issued in Patent Application No. EP 15 85 5744 dated Jun. 29, 2018.
Office action issued in Taiwanese Patent Application No. 104133907 dated Sep. 11, 2018.
Taiwan Office Action issued in Taiwanese Patent Application No. 104133907 dated Feb. 14, 2019.

* cited by examiner

ANTI-FUSE MEMORY AND SEMICONDUCTOR STORAGE DEVICE

TECHNICAL FIELD

The present invention relates to an anti-fuse memory and a semiconductor memory device.

BACKGROUND ART

Conventionally, an anti-fuse memory having a configuration disclosed in U.S. Pat. No. 6,667,902 (Patent document 1) has been known as a one-time programmable anti-fuse memory, which allows one-time programming through breaking an insulating film. The anti-fuse memory disclosed in the Patent document 1 includes a two-transistor configuration, in which a switch transistor and a memory capacitor are disposed adjacent to each other in a well.

In a switch transistor including a transistor configuration, a switch gate electrode is disposed on the well via a switch gate insulating film. A word line is connected to the switch gate electrode. A bit line is connected to one of diffusion regions disposed on the well. A memory gate electrode of the memory capacitor, which forms a pair with the switch transistor, is disposed on the well via a memory gate insulating film. A programming word line, which is different from the word line connected to the switch gate electrode, is connected to the memory gate electrode.

At the time of data programming operation, dielectric breakdown of the memory gate insulating film of the memory capacitor is caused by a voltage difference between a breakdown word voltage and a breakdown bit voltage. The breakdown word voltage is applied from the programming word line to the memory gate electrode. The breakdown bit voltage is applied to the bit line of the switch transistor. Due to the dielectric breakdown of the memory gate insulating film, the memory gate electrode, which has been insulated from the well, is electrically connected the surface of the well, that is, a region in which a memory channel is to be formed.

In a case where the memory gate insulating film has been broken at the time of data reading operation, when a voltage is applied to the programming word line connected to the bit line to be read, the voltage applied to the programming word line is applied to the other diffusion region of the switch transistor through the memory channel. The switch transistor is turned on by the voltage applied from the word line connected to the switch gate electrode and the voltage applied from the bit line connected to the diffusion region. The switch transistor determines an electrical connection state between the memory gate electrode of the corresponding memory capacitor and the memory channel through a change in the voltage applied to the bit line. Thus, the switch transistor determines whether the data has been programmed or not.

CITATION LIST

Patent Literature

Patent Literature 1: U.S. Pat. No. 6,667,902

SUMMARY OF INVENTION

Technical Problem

The conventional anti-fuse memory having the above-described configuration includes the switch transistor separately from the memory capacitor. Hence, a switch control circuit, which turns the switch transistor on or off, needs to be provided separately from a control circuit for applying the breakdown word voltage to the memory capacitor. Miniaturization becomes difficult correspondingly.

In view of the foregoing, an object of the present invention is to suggest an anti-fuse memory and a semiconductor memory device that allow further miniaturization than conventional ones.

Solution to Problem

In order to solve above and other problems, an anti-fuse memory according to the present invention includes at least one memory capacitor and at least one rectifier element. The memory capacitor includes a memory gate electrode disposed via a memory gate insulating film, and a bit line connected to a diffusion region disposed in a well. The rectifier element is disposed between the memory gate electrode and a word line. The rectifier element allows application of voltage from the word line to the memory gate electrode. The rectifier element blocking application of voltage from the memory gate electrode to the word line in accordance with a voltage value applied to the memory gate electrode and the word line.

A semiconductor memory device according to the present invention includes the anti-fuse memories respectively disposed at intersections of the word lines and the bit lines. The anti-fuse memories are those described above.

Advantageous Effects of Invention

According to the present invention, the voltage applied to the memory gate electrode of the memory capacitor and the voltage applied to the word line allow a rectifier element to block the application of voltage from the memory gate electrode to the word line, without the use of a conventional control circuit. Hence, the conventional switch transistor that selectively applies a voltage to the memory capacitor and the conventional switch control circuit that turns the switch transistor on or off are unnecessary, so that miniaturization is achieved correspondingly.

DESCRIPTION OF EMBODIMENTS

Figure 1:
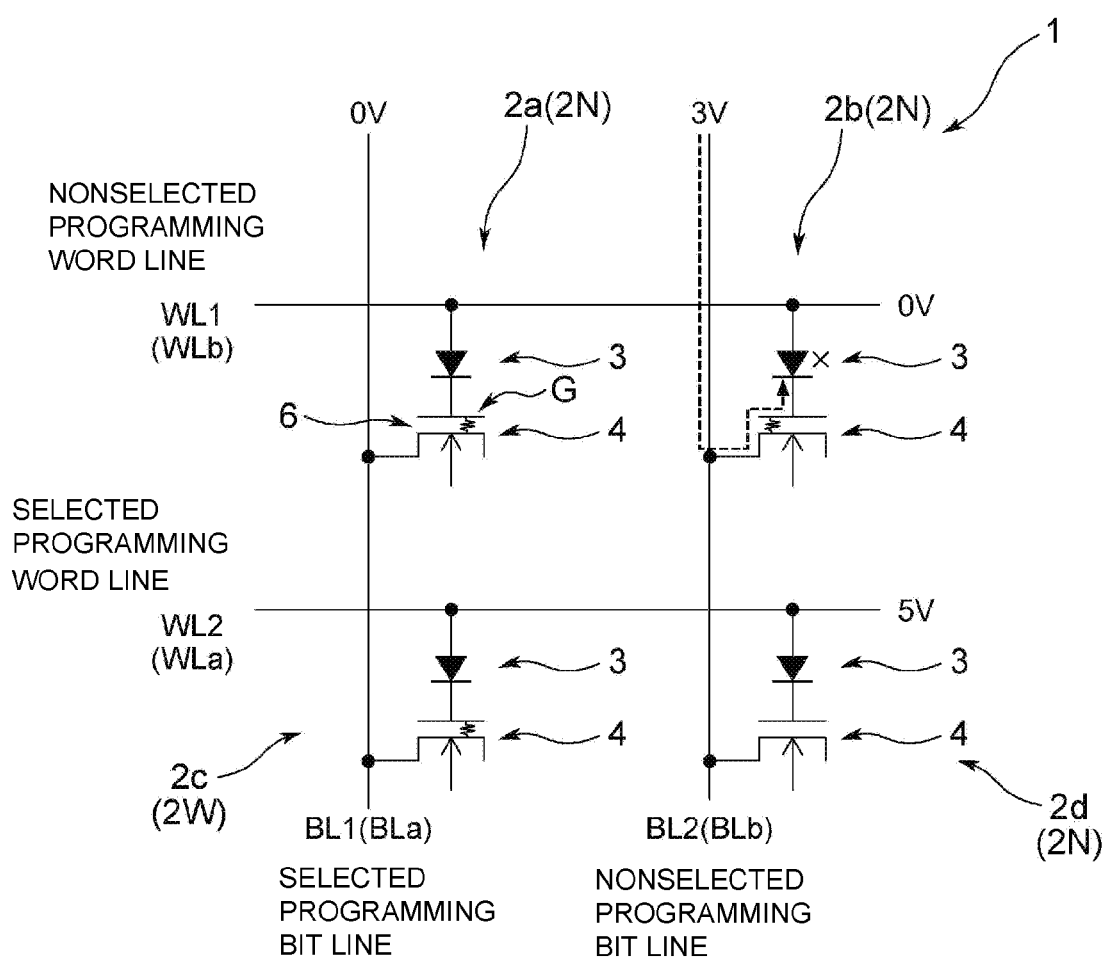
FIG. 1 is a schematic view showing a circuit configuration of a semiconductor memory device including an anti-fuse memory according to the present invention and voltages at respective sites at the time of data programming operation.

Hereinafter, embodiments of the present invention will be described in detail below with reference to the drawings. The descriptions will be made in the following order.
(1. First Embodiment)
1-1. Configuration of semiconductor memory device according to first embodiment
1-2. Data programming operation
1-3. Data reading operation
1-4. Operations and effects
1-5. Rectifier element according to another embodiment
(2. Second Embodiment)
2-1. Configuration of semiconductor memory device according to second embodiment
2-2. Data programming operation
2-2-1. Simultaneously programming the same data into a plurality of memory capacitors
2-2-2. Sequentially programming the same data into a plurality of memory capacitors
2-3. Data reading operation
2-4. Operations and effects
2-5. Rectifier element according to another embodiment
(3. Third Embodiment)
3-1. Configuration of semiconductor memory device according to third embodiment
3-2. Data programming operation
3-3. Operations and effects
(4. Fourth Embodiment)
4-1. Configuration of semiconductor memory device according to fourth embodiment
4-2. Data programming operation
4-3. Operations and effects
(5. Fifth Embodiment)
5-1. Antifuse memory including rectifier element including N-type MOS (Metal-Oxide-Semiconductor) transistor
5-2. Data programming operation
5-3. Operations and effects
(6. Sixth Embodiment)
6-1. Antifuse memory including rectifier element including P-type MOS transistor
6-2. Operations and effects
(7. Other embodiments)
7-1. Antifuse memory including a plurality of memory capacitors and rectifier element including N-type MOS transistor
7-2. Memory capacitor including FinFET (Fin Field Effect Transistor)
7-3. Others
(1) First Embodiment
(1-1) Configuration of Semiconductor Memory Device According to First Embodiment In FIG. 1, a semiconductor memory device 1 includes a configuration in which anti-fuse memories 2a, 2b, 2c, and 2d are arranged in a matrix of rows and columns. The anti-fuse memories 2a and 2b (2c and 2d), which are next to each other in the row direction, share a word line WL1 (WL2). The anti-fuse memories 2a and 2c (2b and 2d), which are next to each other in the column direction, share a bit line BL1 (BL2). The anti-fuse memories 2a, 2b, 2c, and 2d have the same configuration. For example, the anti-fuse memory 2a, which is disposed at the intersection of the first row and the first column, includes a rectifier element 3 and a memory capacitor 4. The rectifier element 3 includes a semiconductor junction structure of a PN junction diode. The memory capacitor 4 includes a memory gate insulating film 6. Dielectric breakdown of the memory gate insulating film 6 is caused by a voltage difference between a memory gate electrode G and the bit line BL1.

In this embodiment, the rectifier element 3 has a configuration in which a P-type semiconductor region and an N-type semiconductor region are joined to each other. The P-type semiconductor region is connected to the word line WL1. The N-type semiconductor region is connected to the memory gate electrode G of the memory capacitor 4. Hence, in the anti-fuse memory 2a, a voltage is applied from the word line WL1 through the rectifier element 3 to the memory gate electrode G of the memory capacitor 4, while a voltage from the memory gate electrode G to the word line WL1 is a reverse bias in the rectifier element 3. Thereby, the rectifier element 3 blocks the voltage applied from the memory gate electrode G to the word line WL.

At the time of data programming operation of the anti-fuse memory 2a (2b, 2c, 2d), the voltage applied to the word line WL1 (WL2) is applied to the memory gate electrode G of the memory capacitor 4 through the rectifier element 3. Thereby a large voltage difference occurs between the memory gate electrode G and the bit line BL1 (BL2), so that dielectric breakdown of the memory gate insulating film 6 of the memory capacitor 4 occurs. Thus, data is programmed into the memory capacitor 4.

Hereinafter, the anti-fuse memories 2a, 2b, 2c, and 2d will be described below in detail. Specifically, two anti-fuse memories 2a and 2b, which are disposed next to each other in the first row in FIG. 1, will be described.

Figure 2:
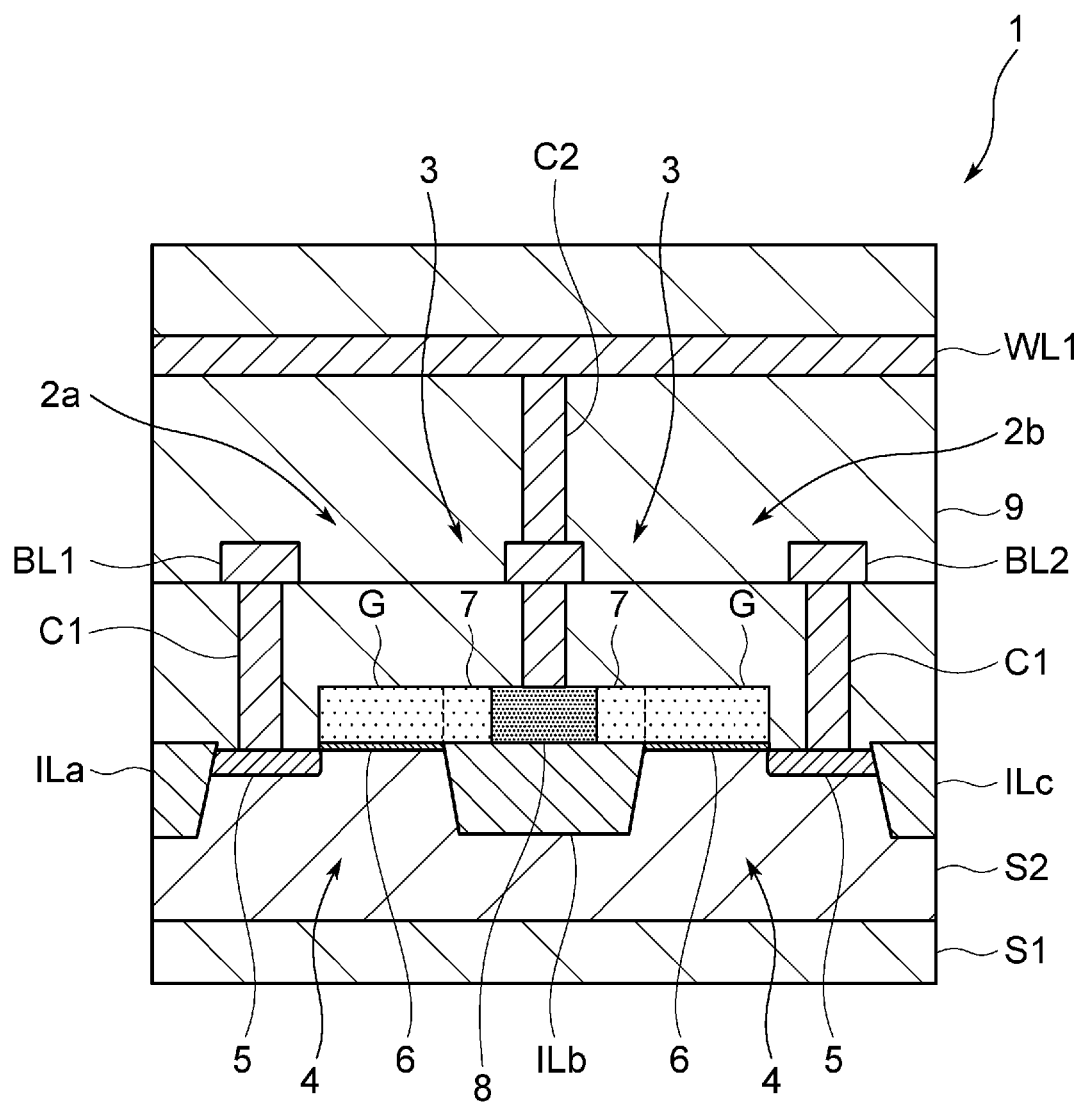
FIG. 2 is a schematic view showing a cross section of the anti-fuse memory according to the present invention.

As shown in FIG. 2, in the semiconductor memory device 1, a P-type or N-type well S2, which is made from Si, for example, is disposed on a semiconductor substrate S1. A rectifier element formation layer ILb, which is composed of an insulating member, is disposed in the surface of the well S2. In the surface of the well S2, the rectifier element formation layer ILb and element isolation layers ILa and ILc are disposed at predetermined intervals such that the rectifier element formation layer ILb is disposed between the element isolation layers ILa and ILc. Each of the element isolation layers ILa and ILc is made of an insulating member.

In this case, in the semiconductor memory device 1, two anti-fuse memories 2a and 2b share one rectifier element formation layer ILb. The memory capacitor 4 of the antifuse memory 2a is disposed between the rectifier element formation layer ILb and the element isolation layer ILa. The memory capacitor 4 of the anti-fuse memory 2b is disposed between the rectifier element formation layer ILb and the element isolation layer ILc.

A diffusion region 5 is disposed in the surface of the well S2 between the rectifier element formation layer ILb and the element isolation layer ILa such that the diffusion region 5 is adjacent to the element isolation layer ILa. The memory gate electrode G of the memory capacitor 4 is disposed via the memory gate insulating film 6 over the well S2 between the diffusion region 5 and the rectifier element formation layer ILb.

Another diffusion region 5 is disposed in the surface of the well S2 between the rectifier element formation layer ILb and the element isolation layer ILc such that the diffusion region 5 is adjacent to the element isolation layer ILc. The memory gate electrode G of the memory capacitor 4 is disposed via the memory gate insulating film 6 over the well S2 between the diffusion region 5 and the rectifier element formation layer ILb.

A contact C1 is disposed in a standing manner on each of the diffusion regions 5. The corresponding bit line BL1 or BL2 is connected to the tip of the contact C1. Hence, a predetermined voltage is applied from the bit line BL1 through the contact C1 to the diffusion region 5 of the memory capacitor 4 of the anti-fuse memory 2a. In addition to the above-described configuration, the rectifier element 3 is disposed on the surface of the rectifier element formation layer ILb. In this embodiment, a P-type semiconductor region 8 and N-type semiconductor regions 7 are disposed on the surface of the rectifier element formation layer ILb such that the P-type semiconductor region 8 is disposed between the N-type semiconductor regions 7. The rectifier element 3 includes the semiconductor junction structure of a PN-junction diode composed of the N-type semiconductor regions 7 and the P-type semiconductor region 8.

In this case, in each of the anti-fuse memories 2a and 2b, the memory gate electrode G of the memory capacitor 4 includes an N-type semiconductor. An end portion of the memory gate electrode G is formed integrally with an end portion of the N-type semiconductor region 7 of the rectifier element 3 disposed on the rectifier element formation layer ILb. In the anti-fuse memories 2a and 2b, the N-type semiconductor regions 7 and the P-type semiconductor region 8 of the rectifier element 3 and the respective memory gate electrodes G of the memory capacitors 4 are disposed within one wiring layer (within the same layer). The N-type semiconductor regions 7, the P-type semiconductor region 8, the memory gate electrodes G of the memory capacitors 4 have the same thickness. Hence, there is no unevenness in joint surfaces among the N-type semiconductor regions 7 and the P-type semiconductor region 8 of the rectifier element 3 and the memory gate electrodes G of the memory capacitors 4 in the anti-fuse memories 2a and 2b. Thus, the overall thickness is reduced. The N-type semiconductor regions 7 and the P-type semiconductor region 8 of the rectifier element 3 and the memory gate electrodes G of the memory capacitors 4 of the anti-fuse memories 2a and 2b are formed in one film forming process. Hence, a production process is simplified as compared with that of the case where the N-type semiconductor regions 7, the P-type semiconductor region 8, and the memory gate electrodes G of the memory capacitors 4 are formed separately.

A contact C2 is disposed in a standing manner on the P-type semiconductor region 8 of the rectifier element 3. The word line WL1, which is disposed above the bit lines BL1 and BL2, is connected through the contact C2 to the P-type semiconductor region 8. For example, in the anti-fuse memory 2a, in a case where a voltage relatively positive to the memory gate electrode G is applied to the word line WL1, the voltage from the word line WL1 is applied through the contact C2, the P-type semiconductor region 8 and the N-type semiconductor regions 7 of the rectifier element 3 to the memory gate electrode G of each of the memory capacitors 4. On the other hand, in the anti-fuse memory 2a, in a case where a voltage relatively positive to the word line WL1 is applied to the memory gate electrode G of the memory capacitor 4, the voltage from the memory gate electrode G is a reverse bias in the rectifier element 3. Hence, the voltage is blocked between the N-type semiconductor region 7 and the P-type semiconductor region 8. The contacts C1 and C2, the rectifier elements 3, the memory gate electrodes G, the bit lines BL1 and BL2, and the word line WL1 disposed over the well S2 are covered with an interlayer insulating layer 9.

Since the semiconductor memory device 1 having the above-described configuration is formed by a typical semiconductor production process using a film forming technology such as photolithography technology, oxidation, or CVD (chemical vapor deposition), etching technology, or ion implantation technique, the descriptions thereof are omitted.

(1-2) Data Programming Operation

Hereinafter, data programming operation to program data only into the anti-fuse memory 2c, which is located at the intersection of the second row and the first column, in the above-configured semiconductor memory device 1 will be described. Here, the anti-fuse memory 2c into which the data is to be programmed may be referred to as a selected program memory 2W. Each of the anti-fuse memories 2a, 2b, and 2d into which data is not to be programmed may be referred to as nonselected program memory 2N. In this case, in the semiconductor memory device 1 shown in FIG. 1, a breakdown bit voltage of 0 V is applied the bit line BL1 (hereinafter may be referred to as selected programming bit line BLa), to which the selected program memory 2W is connected. A nonbreakdown bit voltage of 3 V is applied to the bit line BL (hereinafter may be referred to as nonselected programming bit line BLb), to which the nonselected program memories 2N (the anti-fuse memories 2b and 2d) are connected.

In this case, in the semiconductor memory device 1, a breakdown word voltage of 5 V is applied to the word line WL2 (hereinafter may be referred to as selected programming word line Wla), to which the selected program memory 2W is connected. A nonbreakdown word voltage of 0 V is applied to the word line WL1 (hereinafter may be referred to as nonselected programming word line WLb), to which only the nonselected program memories 2N (the anti-fuse memories 2a and 2b) are connected. In the selected program memory 2W, the breakdown word voltage of 5 V is applied from the selected programming word line WLa to the P-type semiconductor region 8 of the rectifier element 3 while the breakdown bit voltage of 0 V is applied from the selected programming bit line BLa to the diffusion region 5 at an end of the memory capacitor 4.

Thereby, in the selected program memory 2W, the breakdown word voltage is applied from the rectifier element 3 to the memory gate electrode G of the memory capacitor 4 while 0 V is applied from the bit line BL1 to the diffusion region 5. Thus, a channel (not shown) of the memory capacitor 4 is turned on and the channel potential becomes the same as the potential of the bit line BL1. For example, given that a built-in potential in the selected program memory 2W is 0.7 V, a potential difference between the channel and the memory gate electrode G is 4.3 V. Hence the dielectric breakdown of the memory gate insulating film 6 below the memory gate electrode G occurs, and the memory gate electrode G and the diffusion region 5 become conductive state with a low resistance through the channel. Thus, the selected program memory 2W achieves a state in which data has been programmed.

The nonbreakdown bit voltage of 3 V is applied through the nonselected programming bit line BLb to the diffusion region 5 disposed at one end of the memory capacitor 4 in the anti-fuse memory 2d, into which data is not to be programmed. The anti-fuse memory 2d is disposed in another column and connected to the selected programming word line WLa, to which the breakdown word voltage of 5 V is applied. Hence, in the memory capacitor 4, the voltage difference between the memory gate electrode G and the diffusion region 5 is as small as 1.3 V (in consideration of the built-in potential 0.7 V). Hence, even when the memory gate insulating film 6 below the memory gate electrode G of the memory capacitor 4 in the anti-fuse memory 2d has not been broken down, the dielectric breakdown of the memory insulating film 6 of the anti-fuse memory 2d does not occur and the memory gate insulating film 6 remains insulated. Thus, the anti-fuse memory 2d maintains a state in which no data has been programmed.

In a case where the memory gate insulating film 6 has not been broken down in the anti-fuse memory 2b, into which data is not to be programmed and connected to the nonselected programming bit line BLb to which the nonbreakdown bit voltage of 3 V is applied, a nonbreakdown word voltage of 0 V is applied from the nonselected programming word line WLb through the rectifier element 3 to the memory gate electrode G. Hence, in the memory capacitor 4, the voltage difference between the memory gate electrode G and the diffusion region 5, to which the nonselected programming bit line BLb is connected, becomes as small as 3V.

Thus, even when the memory gate insulating film 6 below the memory gate electrode G in the memory capacitor 4 in the anti-fuse memory 2b has not been broken down, the memory gate insulating film 6 remains insulated and a state in which no data has been programmed is maintained.

For example, even when the memory gate insulating film 6 of the memory capacitor 4 has been broken down in the anti-fuse memory 2b, to which the nonbreakdown bit voltage of 3 V is applied from the nonselected programming bit line BLb, a channel is not formed in the memory capacitor 4, so that the memory capacitor 4 blocks the nonbreakdown bit voltage of 3 V because the nonbreakdown word voltage of 0 V is applied to the nonselected programming word line WLb. Hence, the nonbreakdown bit voltage is not applied through the broken-down memory gate insulating film 6 to the memory gate electrode G.

However, in a case where the position of the dielectric breakdown of the memory gate insulating film 6 is extremely close to the diffusion region 5 to which the nonselected programming bit line BLb, for example, is connected, the channel of the memory capacitor 4 cannot block the potential of the bit line BL2. In this case, the nonbreakdown bit voltage of 3 V may be applied to the memory gate electrode G.

In that case, the nonbreakdown bit voltage of 3 V applied from the memory gate electrode G to the rectifier element 3 is a reverse bias applied from the N-type semiconductor region 7 to the P-type semiconductor region 8 in the rectifier element 3. This is because the rectifier element 3, which has the semiconductor junction structure of PN-junction diode including the N-type semiconductor regions 7 and the P-type semiconductor region 8, is disposed between the memory gate electrode G of the memory capacitor 4 and the word line WL1 in the anti-fuse memory 2b of the present invention. Hence, the rectifier element 3 reliably blocks the voltage applied from the memory gate electrode G to the word line WL1.

Without the blocking function of the rectifier element 3, the nonbreakdown bit voltage of 3 V is applied from the bit line BL2 through the anti-fuse memory 2b to the word line WL1. In this case, the voltage of 3 V applied through the anti-fuse memory 2b to the word line WL1 is applied (transmitted) through the word line WL1 to the memory gate electrode G of the anti-fuse memory 2a, which shares the word line WL1. In a case where the memory gate insulating film 6 of the anti-fuse memory 2a has been broken down, the bit line BL1 and the word line WL1 are short-circuited to each other to achieve the same potential. As a result, the bit line BL1 and the bit line BL2 cannot maintain the desirable potentials, and data programming operation into the anti-fuse memory cannot be performed normally.

A voltage difference between the memory gate electrode G and the diffusion region 5 in the memory capacitor 4 is 0 V in the anti-fuse memory 2a, into which data is not to be programmed. The anti-fuse memory 2a is connected to the nonselected programming word line WLb to which nonbreakdown word voltage of 0 V is applied and the nonselected programming bit line BLb to which nonbreakdown bit voltage of 0 V is applied. Even when the memory gate insulating film 6 has not been broken down, the memory gate insulating film 6 remains insulated and a state in which no data has been programmed is maintained. Thus, of the anti-fuse memories 2a, 2b, 2c, and 2d arranged in the matrix of rows and columns in the semiconductor memory device 1, data is programmed only into the anti-fuse memory 2c as desired.

(1-3) Data Reading Operation

Figure 3:
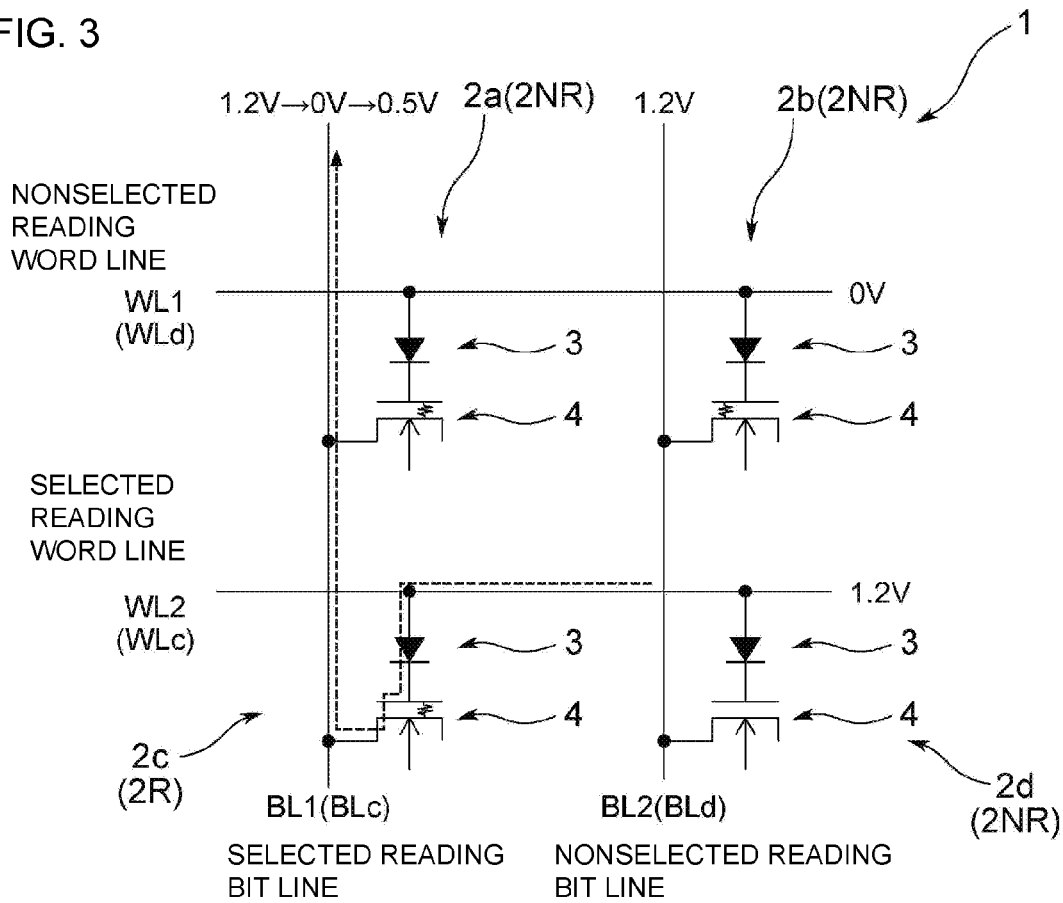
FIG. 3 is a schematic view showing voltages at respective sites at the time of data reading operation in the semiconductor memory device shown in FIG. 1.

As shown in FIG. 3, in which the same reference numerals denote the corresponding parts in FIG. 1, an example will be described in which data is read from the anti-fuse memory 2c disposed at the intersection of the second row and the first column in the semiconductor memory device 1. Here, the memory gate insulating film 6 of each of the anti-fuse memories 2a, 2b, and 2c has been broken down so that data has been programmed into each of the anti-fuse memories 2a, 2b, and 2c. The anti-fuse memory 2a is disposed at the intersection of the first row and the first column. The anti-fuse memory 2b is disposed at the intersection of the first row and the second column. The anti-fuse memory 2c is disposed at the intersection of the second row and the first column. The memory gate insulating film 6 of the anti-fuse memory 2d, which is disposed at the intersection of the second row and the second column, has not been broken down, so that data has not been programmed into the anti-fuse memory 2d.

Here, the anti-fuse memory 2c, from which data is to be read, may be referred to as selected read memory 2R. The anti-fuse memories 2a, 2b, and 2d, from which data is not to be read, may be referred to as nonselected read memories 2NR. In this case, each of the bit line BL1 (hereinafter may be referred to as selected reading bit line BLc), to which the selected read memory 2R is connected, and the bit line BL2 (hereinafter may be referred to as the nonselected reading bit line BLd), to which only the nonselected read memories 2NR are connected, is initially charged to 1.2V. At this time, the selected reading word voltage of 1.2 V is applied to the word line WL2 (hereinafter may be referred to as selected reading word line WLc), to which the selected read memory 2R is connected. The selected reading word voltage of 0 V is applied to the word line WL1 (hereinafter may be referred to as the nonselected reading word line WLd), to which only the nonselected read memories 2NR (the anti-fuse memories 2a and 2b) are connected.

Thereafter, the selected reading bit voltage of 0 V is applied to the selected reading bit line BLc. Thereby, in the selected read memory 2R, the selected reading word voltage of 1.2 V is applied from the selected reading word line WLc to the P-type semiconductor region 8 of the rectifier element 3 while the selected reading bit voltage of 0 V is applied from the selected reading bit line BLc to the diffusion region 5 disposed at an end of the memory capacitor 4.

Since the memory gate insulating film 6 of the memory capacitor 4 in the selected read memory 2R has been broken down and data has been programmed into the selected read memory 2R, a forward bias voltage is applied from the P-type semiconductor region 8 to the N-type semiconductor region 7 of the rectifier element 3 due to the selected reading word voltage of 1.2 V applied to the selected reading word line WLc. Thereby, in the selected read memory 2R, the selected reading word voltage applied from the selected reading word line WLc is applied from the rectifier element 3 through the memory capacitor 4 to the selected reading bit line BLc.

As a result, a voltage which is lowered from the selected reading word voltage of 1.2 V by the value of the built-in potential through the selected read memory 2R (the anti-fuse memory 2C) is applied to the selected reading bit line BLc. Thereby, the selected reading bit line BLc is electrically connected through the selected read memory 2R to the selected reading word line WLc, so that the selected reading bit voltage of 0 V is changed to 0.5 V. Thus, the voltage is changed.

In a case where the memory gate insulating film 6 of the memory capacitor 4 has not been broken down and data has not been programmed into the selected read memory 2R, the memory capacitor 4 blocks the electrical connection between the selected reading word line WLc and the selected reading bit line BLc. Thus, the selected reading bit voltage of 0 V applied to the selected reading bit line BLc is maintained without change.

In the semiconductor memory device 1 described above, whether data has been programmed into the selected read memory 2R (the anti-fuse memory 2c) is determined by detecting whether there is a change in the selected reading bit voltage applied to the selected reading bit line BLc.

In the anti-fuse memory 2a, from which data is not to be read and which is connected to the selected reading bit line BLc, the nonselected reading word voltage of 0 V is applied to the nonselected reading word line WLd. Hence, even when the memory gate insulating film 6 of the memory capacitor 4 has been broken down, this does not cause a change in the voltage applied to the selected reading bit line BLc.

In a case where the voltage value applied to the selected reading bit line BLc is 0.5 V due to the anti-fuse memory 2c, from which data is to be read, and the memory gate insulating film 6 of the memory capacitor 4 of the anti-fuse memory 2a, from which data is not to be read and which shares the selected reading bit line BLc with the anti-fuse memory 2c, has been broken, a reverse bias is applied to the rectifier element 3 of the anti-fuse memory 2a. Hence, the rectifier element 3 blocks the selected reading bit voltage of 0.5 V, and prevents the voltage from being applied to the nonselected reading word line WLd.

The nonselected reading word line WLd, to which the nonselected reading word voltage of 0 V is applied, and the nonselected reading bit line BLd, to which the nonselected reading bit voltage of 1.2 V is applied, are connected to the anti-fuse memory 2b. In this case, even when the memory gate insulating film 6 of the anti-fuse memory 2b has been broken down, the applied voltage is a reverse bias in the rectifier element 3. Hence, the rectifier element 3 blocks the voltage applied from the nonselected reading word line WLd to the nonselected reading bit line BLd.

The selected reading word line WLc, to which the selected reading word voltage of 1.2 V is applied, and the nonselected reading bit line BLd, to which the nonselected reading bit voltage of 1.2 V is applied, are connected to the anti-fuse memory 2d. In this case, even when the insulating film 6 of the anti-fuse memory 2d has been broken down, the selected reading word voltage of 1.2 V does not change and does not affect the reading operation of the anti-fuse memory 2c because the voltage values applied to the selected reading word line WLc and the nonselected reading bit line BLd are the same. Thus, the data is read only from the desired anti-fuse memory 2c among the anti-fuse memories 2a, 2b, 2c, and 2d arranged in the matrix of rows and columns in the semiconductor memory device 1.

(1-4) Operations and Effects

For example, the anti-fuse memory 2c includes the memory capacitor 4 and the rectifier element 3. In the memory capacitor 4, the memory gate electrode G is disposed over the well S2 via the memory gate insulating film 6, and the bit line BL1 is connected to the diffusion region 5 disposed in the surface of the well S2. The rectifier element 3 is disposed between the memory gate electrode G and the word line WL2. The rectifier element 3 allows application of voltage from the word line WL2 to the memory gate electrode G. A voltage applied from the memory gate electrode G to the word line WL2 is a reverse bias in the rectifier element 3. Hence, the rectifier element 3 blocks the voltage applied from the memory gate electrode G to the word line WL2.

When data is programmed into the memory capacitor 4 of the anti-fuse memory 2c, breakdown word voltage applied to the selected programming word line WLa is applied through the rectifier element 3 to the memory gate electrode G of the memory capacitor 4. The dielectric breakdown of the memory gate insulating film 6 of the memory capacitor 4 is caused by the voltage difference between the memory gate electrode G and the selected programming bit line BLa.

In the anti-fuse memory 2b under an operation not to program data, when a high nonbreakdown bit voltage is applied to the bit line BL2 connected to the memory capacitor 4, a channel is not formed in the memory capacitor 4 even when, for example, the memory gate insulating film 6 of the memory capacitor 4 has been broken down, because the nonbreakdown word voltage of 0 V is applied to the nonselected programming word line WLb. Thus, the memory capacitor 4 blocks application of voltage from the nonselected programming bit line BLb to the word line WL1.

At this time, in the anti-fuse memory 2b of the present invention, the rectifier element 3 reliably blocks the application of voltage from the memory gate electrode G to the word line WL1 because the nonbreakdown bit voltage is a reverse bias in the rectifier element 3, even when, for example, the dielectric breakdown of the memory gate insulating film 6 occurred at a position extremely close to the diffusion region 5 connected to the nonselected programming bit line BLb, and the channel of the memory capacitor 4 cannot block the potential of the nonselected programming bit line BLb, and the nonbreakdown bit voltage is applied from the nonselected programming bit line BLb to the memory gate electrode G of the memory capacitor 4.

Hence, the anti-fuse memory 2b is provided with the rectifier element 3, without the use of the conventional control circuit. The rectifier element 3 includes a semiconductor junction structure in which the voltage from the memory gate electrode G to the word line WL1 is applied as a reverse bias in accordance with the voltage value(s) applied to the memory gate electrode G and the word line WL1. The rectifier element 3 blocks application of voltage from the memory gate electrode G to the word line WL1. Therefore the conventional switch transistor that selectively applies a voltage to the memory capacitor and the conventional switch control circuit to allow the switch transistor to turn on or off are not necessary. Thus, miniaturization is achieved correspondingly.

As shown in FIG. 2, in the anti-fuse memories 2a, 2b, 2c, and 2d, the P-type semiconductor regions 8 and the N-type semiconductor regions 7 of the rectifier elements 3 and the memory gate electrodes G of the memory capacitors 4 are formed in the same layer. Hence, the P-type semiconductor regions 8 and the N-type semiconductor regions 7 of the rectifier elements 3 are formed by a typical semiconductor production process, in which the memory gate electrodes G of the memory capacitors 4 having a single-layer structure is formed.

(1-5) Rectifier Element According to Another Embodiment

Figure 4A:
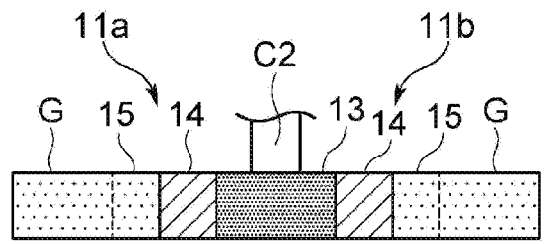
FIG. 4A is a schematic view showing a cross section of an anti-fuse memory according to another embodiment of the anti-fuse memory shown in FIG. 2.

The present invention is not limited to this embodiment and various modifications are possible within the scope of the present invention. The rectifier element 3 including the PN junction diode type semiconductor junction structure, in which the P-type semiconductor region 8 is joined to the N-type semiconductor regions 7, has been described but the present invention is not limited to this. As shown in FIG. 4A (in which the rectifier element formation layer ILb and the like are omitted), in which the same reference numerals denote the corresponding parts in FIG. 2, rectifier elements 11a and 11b including a PIN (P-intrinsic-N) junction diode type semiconductor junction structure, in which the intrinsic semiconductor region 14 is disposed between the P-type semiconductor region 13 and the N-type semiconductor region 15, may be used.

In this case, the rectifier elements 11a and 11b are disposed on the rectifier element formation layer ILb (FIG. 2). The P-type semiconductor region 13, on which the contact C2 is disposed in a standing manner, is disposed at the center between the intrinsic semiconductor regions 14. In the rectifier elements 11a and 11b, the N-type semiconductor regions 15 are joined to the respective intrinsic semiconductor regions 14. Thus, semiconductor junction structure including the PIN junction diode is formed.

In the rectifier element 11a (11b), an end portion of the N-type semiconductor region 15 is formed integrally with an end portion of the memory gate electrode G of the memory capacitor 4 (not shown in FIG. 4A) made of an N-type semiconductor. In this case, the N-type semiconductor regions 15, the intrinsic semiconductor regions 14, and the P-type semiconductor region 13 of the rectifier elements 11a and 11b and the memory gate electrodes G of the memory capacitors 4 are disposed in one wiring layer (the same layer) and have the same thickness. Hence, the joint surfaces of the N-type semiconductor regions 15, the intrinsic semiconductor regions 14, and the P-type semiconductor region 13 of the rectifier elements 11a and 11b and the memory gate electrodes G of the memory capacitors 4 are flush with each other, and thus the overall thickness is reduced.

In each anti-fuse memory including the rectifier elements 11a and 11b, the voltage applied to the word line WL1 is applied through the contact C2, and the P-type semiconductor region 13, the intrinsic semiconductor region 14, and the N-type semiconductor region 15 of the rectifier element 11a or 11b to the memory gate electrode G of the corresponding memory capacitor 4, while the voltage from the memory gate electrode G of the memory capacitor 4 is a reverse bias in the rectifier element 11a (11b) and blocked between the N-type semiconductor region 15 and the P-type semiconductor region 13. Thus, the same effects as those described in the above embodiment are achieved.

Figure 4B:
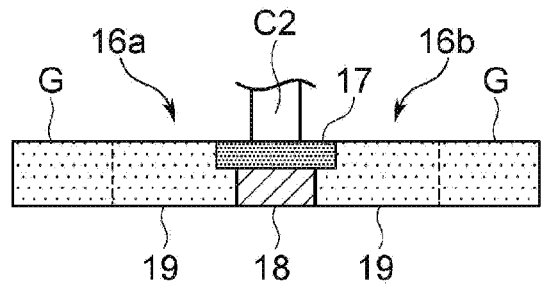
FIG. 4B is a schematic view showing a cross section of an anti-fuse memory according to another embodiment.

FIG. 4B, in which the same reference numerals denote the corresponding parts in FIG. 4A, shows rectifier elements 16a and 16b, which include PN junction diode, according to another embodiment. In this case, the rectifier elements 16a and 16b include an insulating region 18. The insulating region 18 is disposed below the P-type semiconductor region 17, on which the contact C2 is disposed in a standing manner. The N-type semiconductor region 19 is joined to an end portion of the P-type semiconductor region 17 and an end portion of the insulating region 18. Thus, the rectifier elements 16a and 16b achieve a semiconductor junction structure including a PN junction diode, in which the P-type semiconductor region 17 is joined to the N-type semiconductor regions 19.

Similar to the above, the rectifier element 16a (16b) has a configuration in which the end portion of the N-type semiconductor region 19 is formed integrally with an end portion of the memory gate electrode G of the memory capacitor, which is made of an N-type semiconductor. In this case, the N-type semiconductor regions 19 of the rectifier elements 16a and 16b and the memory gate electrodes G of the memory capacitors 4 are disposed in one wiring layer (the same layer) and have the same thickness. The total thickness of the P-type semiconductor region 17 and the insulating region 18 is the same as that of the N-type semiconductor region 19.

The joint surfaces of the P-type semiconductor region 17 and the N-type semiconductor regions 19 of the rectifier elements 16a and 16b and the memory gate electrodes G of the memory capacitors 4 are flush with each another. Also on the bottom of the rectifier elements 16a and 16b, the joint surfaces of the insulating region 18, the N-type semiconductor regions 19, and the memory gate electrodes G of the memory capacitors 4 are flush with each other. Thus, the overall thickness is reduced.

In each anti-fuse memory including the rectifier elements 16a and 16b, a voltage applied to the word line WL1 is applied through the contact C2, the P-type semiconductor region 17 and the N-type semiconductor regions 19 of the rectifier elements 16a and 16b to the respective memory gate electrodes G of the memory capacitors 4, while the voltage from the memory gate electrode G of the memory capacitor 4 is a reverse bias in the rectifier element 16a (16b) and is blocked between the N-type semiconductor region 19 and the P-type semiconductor region 17. Thus, the same effects as those described in the above embodiment are achieved.

(2) Second Embodiment

Figure 5:
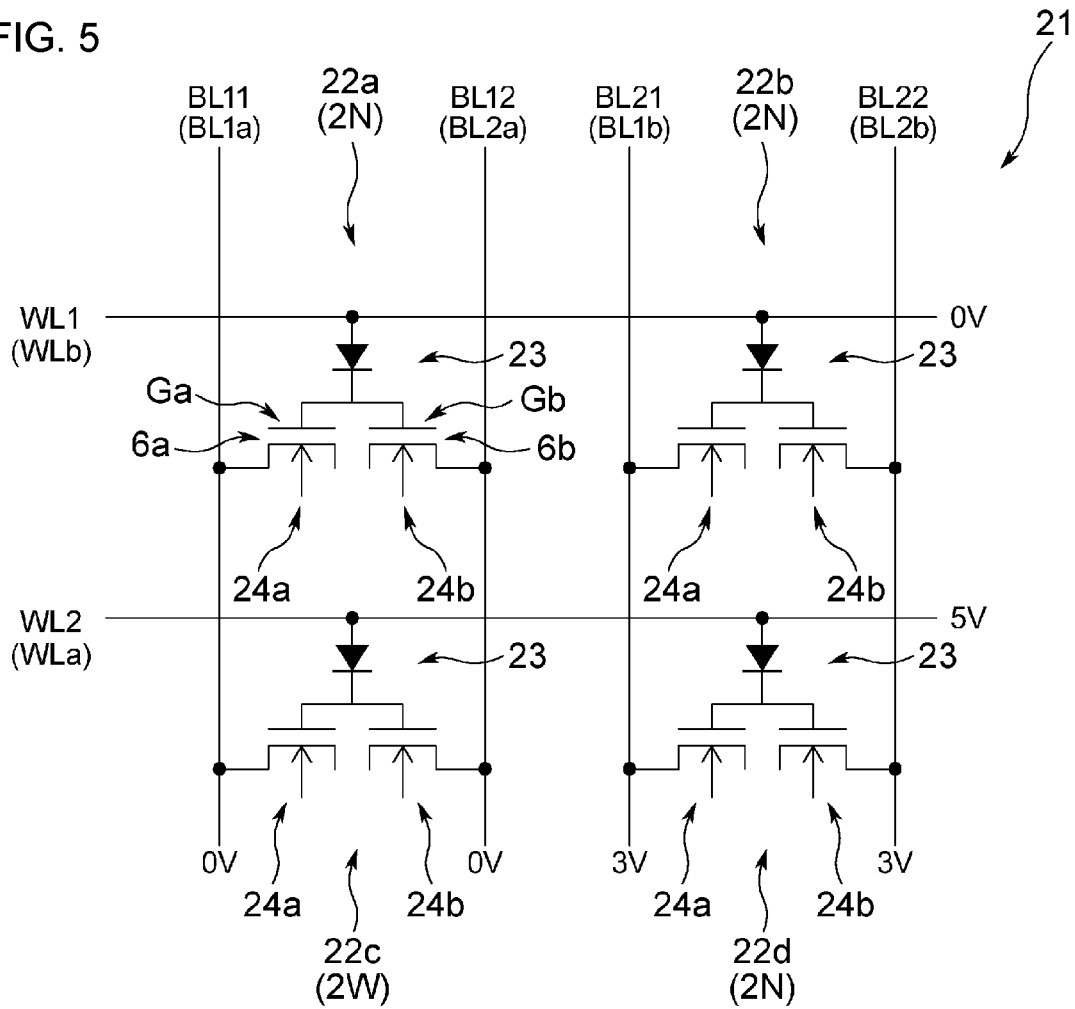
FIG. 5 is a schematic view showing a circuit configuration of a semiconductor memory device including an anti-fuse memory according to a second embodiment and voltages at respective sites at the time of data programming operation.

In FIG. 5, in which the same reference numerals denote the corresponding parts in FIG. 1, a reference numeral 21 denotes a semiconductor memory device according to a second embodiment. In the semiconductor memory device 21, the anti-fuse memories 22a, 22b, 22c, and 22d, in each of which two memory capacitors 24a and 24b are connected to one rectifier element 23, are arranged in the matrix of rows and columns. In this embodiment, the anti-fuse memories 22a, 22b, 22c, and 22d each including two memory capacitors 24a and 24b are described, but the present invention is not limited to this embodiment. Each anti-fuse memory may include three, four, or more memory capacitors.

In the semiconductor memory device 21, each of the anti-fuse memories 22a, 22b, 22c, and 22d stores data of one bit. In each of the anti-fuse memories 22a, 22b, 22c, and 22d, the memory capacitors 24a and 24b store the same data.

In this case, in the semiconductor memory device 21, the anti-fuse memories 22a and 22b (22c and 22d), which are adjacent to each other in the row direction, share the word line WL1 (WL2). The anti-fuse memories 22a and 22c (22b and 22d), which are adjacent to each other in the column direction, share the bit lines BL11 and BL12 (BL21 and BL22).

The anti-fuse memories 22a, 22b, 22c, and 22d, which are arranged in a matrix of rows and columns, have the same configuration. For example, the anti-fuse memory 22a includes a rectifier element 23 and the memory capacitors 24a and 24b. The rectifier element 23 includes a PN junction diode type semiconductor junction structure. The memory capacitors 24a and 24b respectively include the memory gate insulating films 6a and 6b. The dielectric breakdown of the memory gate insulating film 6a (6b) is caused by a voltage difference between the memory gate electrode Ga (Gb) and the word line WL1.

In this embodiment, similar to the above-described first embodiment, the rectifier element 23 includes the P-type semiconductor region joined to each of the N-type semiconductor regions. The P-type semiconductor region is connected to the word line WL1. The N-type semiconductor regions are respectively connected to the memory gate electrodes Ga and Gb of the memory capacitors 24a and 24b.

Thus, in the anti-fuse memory 22a, the same voltage is applied to from the word line WL1 through the rectifier element 23 to the respective memory gate electrodes Ga and Gb of the memory capacitors 24a and 24b, while the voltage from the memory gate electrodes Ga and Gb of the memory capacitors 24a and 24b to the word line WL1 is a reverse bias in the rectifier element 23. Hence the rectifier element 23 blocks the application of voltage from the memory gate electrodes Ga and Gb to the word line WL1.

The voltage applied to the word line WL1 is applied through the rectifier element 23 to each of the memory gate electrodes Ga and Gb of the memory capacitors 24a and 24b of the anti-fuse memory 22a. This causes a large voltage difference between the memory gate electrode Ga (Gb) and the bit line BL11 (BL12), resulting in a breakdown of the memory gate insulating film 6a (6b) of the memory capacitor 24a (24b). Thus the same data is programmed into the memory capacitors 24a and 24b.

Figure 6A:
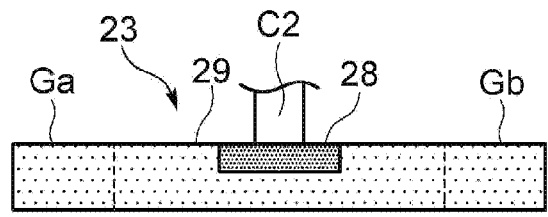
FIG. 6A is a schematic view showing a cross section of an anti-fuse memory including two memory capacitors.

FIG. 6A, in which the same reference numerals denote the corresponding parts in FIG. 2, shows a cross-section of the rectifier element 23 only. In the rectifier element 23, a contact C2, which is connected to, for example, the word line WL1 (FIG. 5), is provided in a standing manner on the P-type semiconductor region 28, and the N-type semiconductor region 29 is disposed to cover the bottom and both side-end portions of the P-type semiconductor region 28. The memory gate electrodes Ga and Gb, which are N-type semiconductors, of the memory capacitors 24a and 24b are formed integrally with the respective side-end portions of the N-type semiconductor region 29 of the rectifier element 23.

Hence, the rectifier element 23 achieves a PN junction diode type semiconductor junction structure, in which the N-type semiconductor region 29 joined to the P-type semiconductor region 28 is joined to the memory gate electrodes Ga and Gb of the memory capacitors 24a and 24b, and in which the voltage applied from the memory gate electrode Ga (Gb) of the memory capacitor 24a (24b) to the word line WL1 is a reverse bias in the rectifier element 23.

The N-type semiconductor region 29 and the P-type semiconductor region 28 of the rectifier element 23 and the memory gate electrodes Ga and Gb of the memory capacitors 24a and 24b are disposed in one wiring layer (the same layer). Each of the memory gate electrodes Ga and Gb has the same thickness as the N-type semiconductor region 29 joined together with the P-type semiconductor region 28. Hence, the joint surfaces of the N-type semiconductor region 29 and the P-type semiconductor region 28 of the rectifier element 23 are flush with the joint surfaces of the N-type semiconductor region 29 and the memory gate electrodes Ga and Gb of the memory capacitors 24a and 24b. Thus, the overall thickness is reduced.

In the anti-fuse memory 22a including the rectifier element 23, a voltage is applied from the word line WL1 through the contact C2, the P-type semiconductor region 28 and the N-type semiconductor region 29 of the rectifier element 23 to the respective memory gate electrodes Ga and Gb of the memory capacitors 24a and 24b, while the voltage from the memory gate electrode Ga (Gb) of the memory capacitor 24a (24b) is a reverse bias in the rectifier element 23 and blocked between the N-type semiconductor region 29 and the P-type semiconductor region 28. Thus, the same effect as that described in the above embodiment is achieved.

In a conventional anti-fuse memory, depending on the conditions of the dielectric breakdown, a phenomenon (hereinafter may be referred to as insulation failure) may occur after data has been programmed by the dielectric breakdown of the program gate insulating film of a memory capacitor, for example. The insulation failure refers to the recovery of a conductive path which has been broken down in the memory gate insulating film and the recovery of the high resistance state, which occur due to temporal changes. To prevent this, an error correction circuit having a complicated configuration is commonly incorporated in the semiconductor memory device. When the phenomenon in which the broken-down memory gate insulating film returns to a high resistance state occurs, the error correction circuit detects and corrects errors in data read from the anti-fuse memory, so as to read correct data from the anti-fuse memory.

However, the conventional semiconductor memory device including the error correction circuit has a complicated configuration due to the error correction circuit, in which logic circuits are combined to each other. In addition, an error correction process, in which reliability of data read from the anti-fuse memory is determined by logic operations, needs to be executed, reducing the reading speed correspondingly.

In contrast, in order to program data in the anti-fuse memory 22a, 22b, 22c, or 22d of the present invention, the same data is programmed into the memory capacitors 24a and 24b by the dielectric breakdown of the respective memory gate insulating films 6a and 6b of the memory capacitors 24a and 24b. Hence, for example, when the memory gate insulating film 6a which has been broken down in the memory capacitor 24a of the anti-fuse memory 22a, 22b, 22c, or 22d returned to the high resistance state due to temporal changes, the correct data is read by referring to the data stored in the memory capacitor 24b, in which the memory gate insulating film 6b has been broken down.

Therefore the anti-fuse memories 22a, 22b, 22c, and 22d of the present invention do not need the conventional error correction circuit, which includes the complicated circuit configuration, and achieves a simple configuration correspondingly. In order to read data from the anti-fuse memory 22a, 22b, 22c, or 22d of the present invention, the data in the memory capacitors 24a and 24b are read collectively, and a logical sum of two data is simply obtained. Thereby whether data has been programmed is read correctly. Complicated logic operations performed by the error correction circuit are not necessary, so that the circuits are downsized correspondingly and the reduction in data reading speed is prevented.

(2-2) Data Programming Operation (2-2-1) Simultaneously Programming the Same Data into a Plurality of Memory Capacitors Hereinafter, a specific example will be described in which data is simultaneously programmed only into each of the memory capacitors 24a and 24b of the anti-fuse memory 22c disposed at the intersection of the second row and the first column in the semiconductor memory device 21. In this case, in the semiconductor memory device 21 shown in FIG. 5, a breakdown bit voltage of 0 V is applied to the pair of bit lines BL11 and BL12 (hereinafter may be referred to as the selected programming bit line BL1a and BL2a) connected to the anti-fuse memory 22c into which data is to be programmed. A nonbreakdown bit voltage of 3 V is applied to each of the pair of the bit lines BL21 and BL22 (hereinafter may be referred to as the nonselected programming bit line BL1b, BL2b) connected only to the anti-fuse memories 22b and 22d, into which data is not to be programmed.

At this time, in the semiconductor memory device 21, a breakdown word voltage of 5 V is applied to the word line WL2 (the selected programming word line WLa), to which the selected program memory 2W (the anti-fuse memory 22c) is connected. A nonbreakdown word voltage of 0 V is applied to the word line WL1 (the nonselected programming word line WLb), to which only the nonselected program memory 2N (the anti-fuse memories 22a and 22b) is connected. Hence, in the selected program memory 2W, the breakdown word voltage of 5 V is applied from the selected programming word line WLa to the P-type semiconductor region 28 of the rectifier element 23. In addition, in the selected program memory 2W, the breakdown bit voltage of 0 V is applied from the selected programming bit lines BL1a and BL2b to the diffusion regions of the corresponding memory capacitors 24a and 24b.

Thereby, given that the built-in potential is, for example, 0.7 V, and in a case where the breakdown word voltage is applied from the rectifier element 23 to each of the memory gate electrodes Ga and Gb of the memory capacitors 24a and 24b in the selected program memory 2W (the anti-fuse memory 22c), a voltage difference of 4.3 V occurs between the memory gate electrode Ga and the diffusion region 5 and between the memory gate electrode Gb and the diffusion region 5 due to the breakdown bit voltage and the breakdown word voltage. Hence, in the memory capacitors 24a and 24b in the selected program memory 2W, the memory gate insulating films 6a and 6b below the respective memory gate electrodes Ga and Gb are broken down, and the memory gate electrodes Ga and Gb and the respective diffusion regions 5 become conductive state with a low resistance. Thus, the selected program memory 2W achieves a state in which the same data has been programmed into the memory capacitors 24a and 24b.

On the other hand, a nonbreakdown bit voltage of 3 V is applied from the nonselected programming bit lines BL1b and BL2b to the corresponding diffusion regions 5 disposed at the ends of the respective memory capacitors 24a and 24b in the anti-fuse memory 22d, into which data is not to be programmed and which is connected to the selected programming word line WLa, to which the breakdown word voltage of 5 V is applied. Thereby, a voltage difference between the memory gate electrode Ga (Gb) and the corresponding diffusion region 5 in the memory capacitor 24a (24b) becomes as small as 1.3 V. Hence, even when the memory gate insulating films 6a and 6b below the memory gate electrodes Ga and Gb in the memory capacitors 24a and 24b in the anti-fuse memory 22d have not been broken down, the dielectric breakdown of the memory gate insulating films 6a and 6b does not occur and the memory gate insulating films 6a and 6b remain insulated. Thus, the anti-fuse memory 22d maintains a state in which no data has been programmed.

In the anti-fuse memory 22b, to which data is not to be programmed and which is connected to the nonselected programming bit lines BL1b and BL2b to each of which the nonbreakdown bit voltage of 3 V is applied, the voltage difference between the memory gate electrode Ga (Gb) and the corresponding diffusion region 5 in the memory capacitor 24a (24b) becomes as small as 3 V. Hence, even when the memory gate insulating films 6a and 6b below the memory gate electrodes Ga and Gb in the memory capacitors 24a and 24b in the anti-fuse memory 22b have not been broken down, the dielectric breakdown of the memory gate insulating films 6a and 6b does not occur and remain insulated. Thus the anti-fuse memory 22b maintains a state in which no data has been programmed.

For example, even when the memory gate insulating films 6a and 6b of the memory capacitors 24a and 24b in the anti-fuse memory 22b, to which the nonbreakdown bit voltage of 3 V is applied from the nonselected programming bit lines BL1b and BL2b, have been broken down, a channel is not formed in the memory capacitors 24a and 24b because the nonbreakdown word voltage of 0 V is applied to the nonselected programming word line WLb. Hence the memory capacitors 24a and 24b block the nonbreakdown bit voltage of 3 V applied from the nonselected programming bit lines BL21b and BL22b, so that the nonbreakdown bit voltage is prevented from being applied to the memory gate electrodes Ga and Gb through the memory gate insulating films 6a and 6b that have been broken down.

However, in a case where the positions of the dielectric breakdown of the memory gate insulating films 6a and 6b are extremely close to the diffusion regions 5 connected to, for example, the bit lines BL21 and BL22, respectively, the potentials of the bit lines BL21 and BL22 may not be blocked by the channels of the memory capacitors 24a and 24b. In this case, the nonbreakdown bit voltage of 3 V applied to the diffusion regions 5 may be applied to the memory gate electrodes Ga and Gb.

In the anti-fuse memory 22b, the nonbreakdown bit voltage of 3 V applied from each of the memory gate electrodes Ga and Gb to the rectifier element 23 is a reverse bias applied from the N-type semiconductor region to the P-type semiconductor region in the rectifier element 23, because the rectifier element 23, which performs rectification (commutation) due to the semiconductor junction structure of the N-type semiconductor region and the P-type semiconductor region, is connected to the memory gate electrodes Ga and Gb of the memory capacitors 24a and 24b.

In the anti-fuse memory 22a, into which data is not to be programmed and which is connected to the nonselected programming word line WLb, to which the nonbreakdown word voltage of 0 V is applied, and the nonselected programming bit lines BL1b and BL2b, to each of which the nonbreakdown bit voltage of 0 V is applied, a voltage difference between the memory gate electrode Ga and the diffusion region 5 in the memory capacitor 24a is 0 V, and a voltage difference between the memory gate electrode Gb and the diffusion region 5 in the memory capacitor 24b is 0 V. Even when the memory gate insulating films 6a and 6b have not been broken down, the dielectric breakdown of the memory gate insulating films 6a and 6b do not occur and the memory gate insulating films 6a and 6b remain insulated. Hence, the anti-fuse memory 22a maintains a state in which no data has been programmed. Thus, in the semiconductor memory device 21, data is programmed only into memory capacitors 24a and 24b of the desired anti-fuse memory 22c among the anti-fuse memories 22a, 22b, 22c, and 22d arranged in the matrix of rows and columns.

(2-2-2) Sequentially Programming the Same Data into a Plurality of Memory Capacitors Next, a data programming operation is specifically described, in which the same data is sequentially programmed into the memory capacitors 24a and 24b of, for example, the anti-fuse memory 22c disposed at the intersection of the second row and the first column in the semiconductor memory device 21 having the above-described configuration. In order to program data into, for example, the anti-fuse memory 22c disposed at the intersection of the second row and the first column in the semiconductor memory device 21, data is programmed by the dielectric breakdown of the memory gate insulating film 6a of the memory capacitor 24a of the anti-fuse memory 22c, and then the data is programmed by the dielectric breakdown of the memory gate insulating film 6b of the memory capacitor 24b of the anti-fuse memory 22c.

Descriptions with regard to the nonselected program memory 2N (the anti-fuse memories 2a, 2b, and 2d) are similar to those described in "(2-2-1) Simultaneously programming the same data into a plurality of memory capacitors". Hereinafter, the anti-fuse memory 22c, in which the same data is sequentially programmed into the memory capacitors 24a and 24b, will be described.

In this case, first, a breakdown bit voltage of 0 V is applied to the selected programming bit line BL1a connected to the anti-fuse memory 22c, into which data is to be programmed, while a nonbreakdown bit voltage of 3 V is applied to the selected programming bit lines BL2a, which forms a pair with the selected programming bit line BL1a.

At this time, the breakdown word voltage of 5 V is applied through the selected programming word line WLa to the rectifier element 23 in the anti-fuse memory 22c, into which data is to be programmed. Hence, a voltage difference of 4.3 V occurs between the memory gate electrode Ga and the diffusion region 5 of the memory capacitor 24a, to which the breakdown bit voltage of 0 V is applied from the selected programming bit line BL1a. Thereby dielectric breakdown of the memory gate insulating film 6a, which is disposed below the memory gate electrode Ga, occurs in the memory capacitor 24a.

At this time, in the anti-fuse memory 22c, into which data is to be programmed, the nonbreakdown bit voltage of 3 V has been initially applied from the selected programming bit line BL2a to the memory capacitor 24b. In the memory capacitor 24b, there is only a small voltage difference (1.3 V) between the memory gate electrode Gb and the diffusion region 5. Hence, the dielectric breakdown of the memory gate insulating film 6b, which is disposed below the memory gate electrode Gb, does not occur and the memory gate insulating film 6b remains insulated.

As described above, in the anti-fuse memory 22c, into which data is to be programmed, the dielectric breakdown of the memory gate insulating film 6a, which is disposed below the memory gate electrode Ga of the memory capacitor 24a, occurs first. Hence the memory gate electrode Ga and the diffusion region 5 become conductive state with a low resistance. Thus, anti-fuse memory 22c achieves a state in which data has been programmed only into the memory capacitor 24a.

Next, in the semiconductor memory device 21, the nonbreakdown bit voltage of 3 V, which is different from the previously applied voltage, is applied to the selected programming bit line BL1a connected to the anti-fuse memory 22c, to which data is to be programmed. A breakdown bit voltage of 0 V, which is different from the previously applied voltage, is applied to the selected programming bit line BL2a, connected to the anti-fuse memory 22c, to which data is to be programmed.

At this time, in a case where the built-in potential is, for example, 0.7 V, a breakdown word voltage of 5 V is applied to the rectifier element 23 through the selected programming word line WLa in the anti-fuse memory 22c, to which data is to be programmed. A voltage difference of 4.3 V occurs between the memory gate electrode Gb and the diffusion region 5 of the memory capacitor 24b, to which the breakdown bit voltage of 0 V is applied from the selected programming bit line BL2a. Thereby, in the memory capacitor 24b, dielectric breakdown of the memory gate insulating film 6b, which is disposed below the memory gate electrode Gb, occurs.

Thereby, in the anti-fuse memory 22c, into which data is to be programmed, data is programmed into the memory capacitor 24a first. Then, in the memory capacitor 24b, the dielectric breakdown of the memory gate insulating film 6b, which is disposed below the memory gate electrode Gb, occurs. The memory gate electrode Gb and the diffusion region 5 become conductive state with a low resistance. Thus, the anti-fuse memory 22c achieves a state in which data has been programmed only into the memory capacitor 24b.

As described above, in order to program data in the anti-fuse memory 22c of the semiconductor memory device 21, the data is programmed into the memory capacitor 24a of the anti-fuse memory 22c first, and then the data is programmed into the memory capacitor 24b of the anti-fuse memory 22c.

(2-3) Data Reading Operation

Next, an example will be briefly described in which data is read from the anti-fuse memory 22c, which is disposed at the intersection of the second row and the first column in the semiconductor memory device 21. Descriptions with regard to data reading operation to read data from the anti-fuse memory 22c, which is disposed at the intersection of the second row and the first column in the semiconductor memory device 21, are similar to the "(1-3) Data reading operation" described above. Hereinafter, descriptions will be made only with regard to the anti-fuse memory 22c.

In this case, the selected reading bit voltage of 0 V is applied to each of the bit line BL11 (the selected reading bit line) and the bit line BL12 (the selected reading bit line), which are connected to the anti-fuse memory 22c (the selected read memory), from which data is to be read while selected reading word voltage of 1.2 V is applied to the word line WL2 (the selected reading word line) connected to the anti-fuse memory 22c, from which data is to be read.

Thereby, the selected reading word voltage of 1.2 V is applied from the word line WL2, which is the selected reading word line, to the P-type semiconductor region of the rectifier element 3 in the anti-fuse memory 22c, from which data is to be read, while the selected reading bit voltage of 0 V is applied from the bit line BL11 to the diffusion region 5 disposed at the end of the memory capacitor 24a. Similarly, the selected reading bit voltage of 0 V is applied from the bit line BL12 to the diffusion region 5 disposed at the end of the memory capacitor 24b.

For example, in a case where the respective memory gate insulating films 6a and 6b of the memory capacitors 24a and 24b have been broken down and data has been programmed into the anti-fuse memory 22c, from which data is to be read, a forward bias voltage is applied from the P-type semiconductor region 8 to the N-type semiconductor region 7 of the rectifier element 23 due to the selected reading word voltage of 1.2 V applied from the word line WL2. Thereby, the selected reading word voltage is applied from the word line WL2 through the rectifier element 23 and the memory capacitor 24a to the bit line BL11 and also through the rectifier element 23 and the memory capacitor 24b to the bit line BL12.

Consequently, a voltage which is lowered from the selected reading word voltage of 1.2 V by the value of the built-in potential through the anti-fuse memory 22c, from which data is read, is applied to the bit line BL11, which is one of the selected reading bit lines. Thereby the selected reading bit voltage of 0 V is changed to 0.5 V. Thus, the voltage value is changed.

At this time, a voltage which is lowered from the selected reading word voltage of 1.2 V by the value of the built-in potential through the anti-fuse memory 22c is applied to the bit line BL12, which is the other of the selected reading bit lines. Thereby the selected reading bit voltage of 0 V is changed to 0.5 V. Thus, the voltage value is changed.

Thus, in the semiconductor memory device 21, whether data has been programmed into the anti-fuse memory 22c, from which data is to be read, is determined by detecting whether there is a change in the selected reading bit voltage applied to each of the bit lines BL11 and BL12.

In a case where the phenomenon in which the broken-down memory gate insulating film 6a of, for example, the memory capacitor 24a returns to a high resistance state due to temporal changes occurs at the time of reading data from the anti-fuse memory 22c, the memory gate insulating film 6a of the memory capacitor 24a blocks the voltage applied from the word line WL2 to the bit line BL11, so that the voltage applied to the bit line BL11 remains 0 V.

At this time, a possibility that the broken-down memory gate insulating film 6b of the memory capacitor 24b returns to a high resistance state due to temporal changes in addition to the memory capacitor 24a is extremely low in the anti-fuse memory 22c. Hence, a voltage, which is lowered from the selected reading word voltage of 1.2 V by the value of the built-in potential at the anti-fuse memory 22c, from which data is read, is applied to the bit line BL12 connected to the memory capacitor 24b. Thereby the selected reading bit voltage of 0 V is changed to 0.5 V. Thus, the voltage value is changed.

Thus, it is determined that data has been programmed into the anti-fuse memory 22c of the semiconductor memory device 21 in a case where there is a change in the selected reading bit voltage applied to one of the bit lines BL11 and BL12, which are connected to the anti-fuse memory 22c, from which data is to be read.

As described above, the anti-fuse memory 22c according to the present invention is capable of correctly reading data programmed into the anti-fuse memory 22c, without the use of the conventional error correction circuit having a complicated circuit configuration. The anti-fuse memory 22c according to the present invention is capable of correctly reading data through determining whether there is a change in the voltage applied to one of the bit lines BL11 and BL12, which are connected to the memory capacitors 24a and 24b. Complicated logic operations performed by the conventional error correction circuit are not necessary. Therefore the circuits in the anti-fuse memory 22c are downsized and data reading speed is increased.

(2-4) Operations and Effects

The anti-fuse memory 22c includes the memory capacitor 24a, the memory capacitor 24b, and the rectifier element 23. In the memory capacitor 24a, the memory gate electrode Ga is disposed over the well S2 via the memory gate insulating film 6a, and the bit line BL11 is connected to one of the diffusion regions 5 disposed in the surface of the well S2. In the memory capacitor 24b, the memory gate electrode Gb is disposed over the well S2 via the memory gate insulating film 6b, and the bit line BL12 is connected the other of the diffusion regions 5 disposed in the surface of the well S2. The rectifier element 23 is disposed between the word line WL2 and each of the memory gate electrodes Ga and Gb, and the rectifier element 23 allows application of voltage from the word line WL2 to each of the memory gate electrodes Ga and Gb. A voltage applied from the memory gate electrode Ga (Gb) to the word line WL2 is a reverse bias in the rectifier element 23. Thus, the rectifier element 23 blocks the voltage applied from the memory gate electrode Ga (Gb) to the word line WL2.

At the time of programming data into the memory capacitors 24a and 24b of the anti-fuse memory 22c, the breakdown word voltage applied from the selected programming word line WLa is applied through the rectifier element 23 to the memory gate electrodes Ga and Gb of the memory capacitors 24a and 24b.

In the anti-fuse memory 22c, the dielectric breakdown of the memory gate insulating film 6a of the memory capacitor 24a is caused by a voltage difference between the selected programming bit line BL1a and the memory gate electrode Ga of the memory capacitor 24a. Simultaneously with this or with a time lag, the dielectric breakdown of the memory gate insulating film 6b of the memory capacitor 24b is caused by a voltage difference between the selected programming bit line BL2a and the memory gate electrode Gb of the memory capacitor 24b.

In the anti-fuse memory 22b, into which data is not to be programmed, a high nonbreakdown bit voltage is applied to each of the bit line BL21 connected to the memory capacitor 24a and the bit line BL 22 connected to the memory capacitor 24b. Even when the memory gate insulating films 6a and 6b of the memory capacitors 24a and 24b have been broken down, a channel is not formed in the memory capacitors 24a and 24b because the nonbreakdown word voltage of 0 V is applied to the nonselected programming word line WLb. Hence, the memory capacitors 24a and 24b block the application of voltage from the nonselected programming bit lines BL1b and BL2b to the word line WL1.

In the anti-fuse memory 22b of the present invention, for example, even when the dielectric breakdown of the memory gate insulating films 6a and 6b occurred at positions extremely close to the diffusion regions connected to the nonselected programming bit lines BL1b and BL2b, and the channels of the memory capacitors 24a and 24b may not block the potentials of the nonselected programming bit lines BL1b and BL2b, and the nonbreakdown bit voltage is applied from at least one of the nonselected programming bit lines BL1b and BL2b to the memory gate electrodes Ga and Gb of the memory capacitors 24a and 24b, the nonbreakdown bit voltage is a reverse bias in the rectifier element 23. Thus, the rectifier element 23 reliably blocks the application of voltage from each of the memory gate electrodes Ga and Gb to the word line WL1.

Similar to the first embodiment, the anti-fuse memory 22b is provided with the rectifier element 23, without the use of the conventional control circuit. The rectifier element 23 includes a semiconductor junction structure, in which the voltage from the memory gate electrodes Ga and Gb to the word line WL1 is applied as a reverse bias in accordance with the voltage values applied to the memory gate electrodes Ga and Gb and the word line WL1. The rectifier element 3 reliably blocks the voltage applied from the memory gate electrodes Ga and Gb to the word line WL1. Therefore the conventional switch transistor that selectively applies a voltage to each memory capacitor and the conventional switch control circuit that allows the switch transistor to turn on or off are not necessary. Thus, miniaturization is achieved correspondingly.

In the anti-fuse memory 22c according to the second embodiment, the dielectric breakdown of both memory gate insulating films 6a and 6b of the memory capacitors 24a and 24b is caused to program data. Even when the insulation failure occurred in the memory gate insulating film 6 of the memory capacitor 24a, the same data is read from the memory capacitor 24b. It is considered that data has been programmed when data read from the memory capacitors 24a and 24b do not match each other.

Whether data has been programmed into the anti-fuse memory 22c of the present invention is inferred without the use of the conventional error correction circuit having a complicated circuit configuration. The conventional error correction circuit is not necessary, and the circuit configuration is simplified correspondingly. At the time of reading data from the anti-fuse memory 22c of the present invention, data is read from the memory capacitors 24a and 24b and a logical sum of two data is simply obtained. Thereby correct data is read. Complicated logic operations performed by the error correction circuit are not necessary, so that the circuits are downsized correspondingly and the reduction in data reading speed is prevented.

(2-5) Rectifier Element According to Another Embodiment

The present invention is not limited to this embodiment and various modifications are possible within the scope of the present invention. The rectifier element 23 including the PN junction diode type semiconductor junction structure, in which the P-type semiconductor region 28 is joined to the N-type semiconductor region 29, has been described but the present invention is not limited to this. A rectifier element including a PIN (P-intrinsic-N) diode type semiconductor junction structure, in which the intrinsic semiconductor region is disposed between the P-type semiconductor region and the N-type semiconductor region, may be used.

Figure 6B:
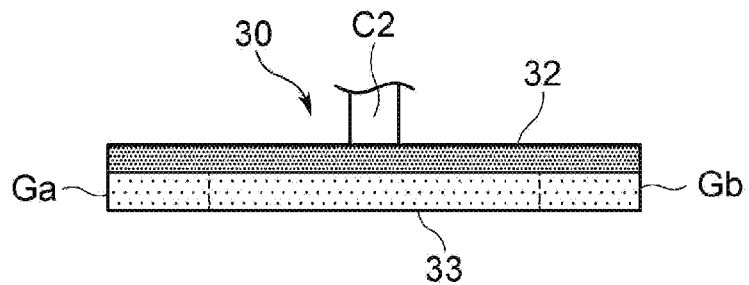
FIG. 6B is a schematic view showing a cross section of another embodiment of the anti-fuse memory shown in FIG. 6A.

FIG. 6B, in which the same reference numerals denote the corresponding parts in FIG. 6A, shows a rectifier element according to another embodiment. The respective memory gate electrodes Ga and Gb of the memory capacitors 24a and 24b, and the N-type semiconductor region 33 of the rectifier element 30 are disposed below the P-type semiconductor region 32, on which the contact C2 is disposed in a standing manner.

In this case, in the rectifier element 30, the N-type semiconductor region 33 is disposed on the rectifier element formation layer ILb (FIG. 2). The memory gate electrodes Ga and Gb of the memory capacitors 24a and 24b are respectively disposed at the ends of the N-type semiconductor region 33. In the rectifier element 30, the thickness of the N-type semiconductor region 33 is the same as the thickness of each of the memory gate electrodes Ga and Gb of the memory capacitors 24a and 24b. The joint surfaces of the N-type semiconductor region 33 and the memory gate electrodes Ga and Gb of the memory capacitors 24a and 24b are flush with each other, and thus the overall thickness is reduced.

In the anti-fuse memory including the rectifier element 30, for example, the voltage is applied from the word line WL1 through the contact C2, the P-type semiconductor region 32 and the N-type semiconductor region 33 of the rectifier element 30 to the memory gate electrode Ga and Gb of the memory capacitor 24a and 24b. On the other hand, the voltage from the memory gate electrodes Ga (Gb) of the memory capacitor 24a (24b) is a reverse bias in the rectifier element 30 and blocked between the N-type semiconductor region 33 and the P-type semiconductor region 32. Thus, the same effects as those described in the above embodiment are achieved.

(3) Third Embodiment (3-1) Configuration of Semiconductor Memory Device According to Third Embodiment The above second embodiment describes the anti-fuse memories 22a, 22b, 22c, and 22d, in each of which one rectifier element 23 includes the memory capacitors 24a and 24b. The present invention is not limited to this. An anti-fuse memory in which rectifier elements are provided for the respective memory capacitors 24a and 24b may be used.

Figure 7:
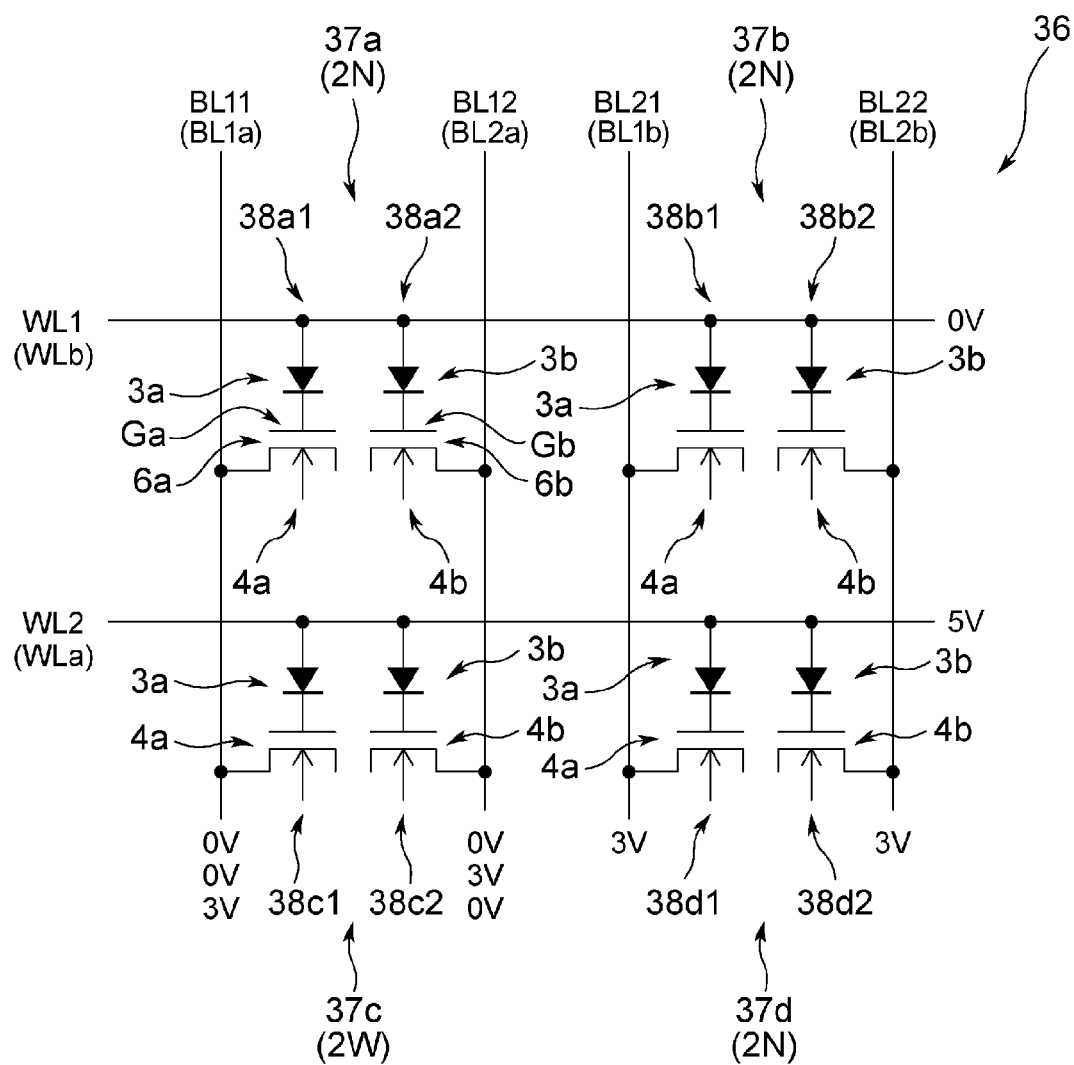
FIG. 7 is a schematic view showing a circuit configuration of a semiconductor memory device including an anti-fuse memory according to a third embodiment and voltages at respective sites at the time of data programming operation.

FIG. 7, in which the same reference numerals denote the corresponding parts in FIG. 5, shows a semiconductor memory device 36 including the anti-fuse memories 37a, 37b, 37c, and 37d according to a third embodiment. Here, the anti-fuse memories 37a, 37b, 37c, and 37d have the same configuration. For example, the anti-fuse memory 37a, which is disposed at the intersection of the first row and the first column, includes a first memory 38a1 and a second memory 38a2. Data of one bit is stored by the first memory 38a1 and the second memory 38a2.

In the anti-fuse memory 37a, the first memory 38a1 and the second memory 38a2 have the same configuration. The first memory 38a1 includes a rectifier element 3a and a memory capacitor 4a. The rectifier element 3a includes a PN junction diode type semiconductor junction structure and performs rectification. The memory capacitor 4a includes a memory gate insulating film 6a. Dielectric breakdown of the memory gate insulating film 6a is caused by a voltage difference between the word line WL1 and the bit line BL11. The second memory 38a2 includes a rectifier element 3b and a memory capacitor 4b. The rectifier element 3b includes a PN junction diode type semiconductor junction structure and performs rectification. The memory capacitor 4b includes a memory gate insulating film 6b. Dielectric breakdown of the memory gate insulating film 6b is caused by a voltage difference between the word line WL1 and the bit line BL12.

The rectifier elements 3a and 3b are provided respectively for the first memory 38a1 and the second memory 38a2. Each of the rectifier elements 3a and 3b includes a configuration in which the P-type semiconductor region is joined to the N-type semiconductor region. The P-type semiconductor region is connected to the word line WL1. The N-type semiconductor regions are respectively connected to the corresponding the memory gate electrodes Ga and Gb of the memory capacitors 4a and 4b. Hence, in the anti-fuse memory 37a, a voltage is applied from the word line WL1 through the rectifier elements 3a and 3b to the memory gate electrodes Ga and Gb. A voltage applied from the memory gate electrode Ga (Gb) to the word line WL1 is a reverse bias in the rectifier element 3a (3b). Thus, the rectifier elements 3a and 3b block the application of voltage from each of the memory gate electrodes Ga and Gb to the word line WL1.

In the semiconductor memory device 36, in which the anti-fuse memories 37a, 37b, 37c, and 37d are arranged in a matrix of rows and columns, the anti-fuse memories 37a and 37b (37c and 37d) share the word line WL1 (WL2) while the anti-fuse memories 37a and 37c (37b and 37d) arranged in the column direction share the bit line BL11 and BL12 (BL21 and BL22).

In this case, the word line WL1 is connected to the rectifier element 3a of the first memory 38a1, the rectifier element 3b of the second memory 38a2, the rectifier element 3a of the first memory 38b1, and the rectifier element 3b of the second memory 38b2. The anti-fuse memory 37a includes the first memory 38a1 and the second memory 38a2. The anti-fuse memory 37b is disposed in the same row as the anti-fuse memory 37a, and includes the first memory 38b1 and the second memory 38b2. The word line WL2, which is disposed in another row, is connected to the rectifier elements 3a and 3b of the first memories 38c1 and 38d1 and the second memories 38c2 and 38d2 of the anti-fuse memories 37c and 37d arranged next to each other in the row direction.

The bit line BL11 disposed in the first column is connected to the memory capacitor 4a of the first memory 38a1 of the anti-fuse memory 37a and the memory capacitor 4a of the first memory 38c1 of the anti-fuse memory 37c, which is disposed in the same column as the anti-fuse memory 37a. The bit line BL12 disposed in the first column is connected to the memory capacitor 4b of the second memory 38a2 of the anti-fuse memory 37a and the memory capacitor 4b of the second memory 38c2 of the anti-fuse memory 37c, which is disposed in the same column as the anti-fuse memory 37a. The bit lines BL21 and BL22 are disposed in the second column. The bit line BL21 is connected to the memory capacitors 4a of the first memories 38b1 and 38d1 of the anti-fuse memories 37b and 37d, which are arranged next to each other in the column direction. The bit line BL22 is connected to the memory capacitors 4b of the second memories 38b2 and 38d2 of the anti-fuse memories 37b and 37d.

(3-2) Data Programming Operation

Data is programmed only into the desired anti-fuse memory 37c in the semiconductor memory device 36 according to the third embodiment by following the above-described "(2-2-1) Simultaneously programming the same data into a plurality of memory capacitors" and "(2-2-2) Sequentially programming the same data into a plurality of memory capacitors".

Here, for example, in the anti-fuse memory 22c according to the above second embodiment as shown in FIG. 5, the respective memory gate electrodes Ga and Gb of the memory capacitors 24a and 24b are connected to one rectifier element 23. Hence, in a case where the memory gate insulating films 6a and 6b of the memory capacitors 24a and 24b have been broken down, the memory capacitors 24a and 24b may be electrically connected. In this case, in anti-fuse memory 22c according to the second embodiment, the bit lines BL11 and BL12 may be electrically connected through the memory capacitors 24a and 24b. In a case where the breakdown bit voltage of 0 V is being applied to the bit line BL11, it is difficult to maintain the nonbreakdown bit voltage of 3 V applied to the bit line BL12 in the process described in "(2-2-2) Sequentially programming the same data into a plurality of memory capacitors".

In the anti-fuse memory 37c according to the third embodiment shown in FIG. 7, the rectifier elements 3a and 3b are provided for the respective memory capacitors 4a and 4b. The memory capacitors 4a and 4b are electrically insulated from each other. Hence, the bit lines BL11 and BL12 are prevented from being electrically connected through the memory capacitors 4a and 4b even when the memory gate insulating films 6a and 6b of the memory capacitors 4a and 4b have been broken down.

When the process described in "(2-2-2) Sequentially programming the same data into a plurality of memory capacitors" is performed in the anti-fuse memory 37c, the nonbreakdown bit voltage of 3 V applied to the bit line BL12 is reliably maintained even when the breakdown bit voltage of 0 V is applied to the bit line BL11.

Data is read from the desired anti-fuse memory 22c in the semiconductor memory device according to the third embodiment by following "(2-3) Data reading operation" described above. Hence, the descriptions are omitted.

(3-3) Operations and Effects

Similar to the above, in a case where a high nonbreakdown bit voltage is applied to each of the bit line BL21 connected to the memory capacitor 4a and the bit line BL22 connected to the memory capacitor 4b, and the memory gate insulating films 6a and 6b of the memory capacitors 4a and 4b in the anti-fuse memory 37b, to which data is not to be programmed, have been broken down, a channel is not formed in the memory capacitors 4a and 4b because the nonbreakdown word voltage of 0 V is applied to the nonselected programming word line WLb. Hence the memory capacitors 4a and 4b block the application of voltage from the nonselected programming bit line BLb to the word line WL1.

In the anti-fuse memory 37b of the present invention, for example, even when the dielectric breakdown of the memory gate insulating films 6a and 6b occurred at positions extremely close to the diffusion regions connected to the nonselected programming bit lines BL1b and BL2b, and the channel of the memory capacitor 4 may not block the potential of the nonselected programming bit line BL21b, and the nonbreakdown bit voltage is applied from the nonselected programming bit lines BL1b and BL2b to the respective memory gate electrodes Ga and Gb of the memory capacitors 4a and 4b, the nonbreakdown bit voltage is a reverse bias in the rectifier elements 3a and 3b. Hence, the rectifier elements 3a and 3b reliably block the application of voltage from the memory gate electrodes Ga and Gb to the word line WL1.

Similar to the first embodiment, the anti-fuse memory 37b is provided with the rectifier elements 3a and 3b, without the use of the conventional control circuit. The rectifier element 3a (3b) including a semiconductor junction structure is provided in which the voltage from the memory gate electrode Ga (Gb) to the word line WL1 is applied as a reverse bias in accordance with the voltage values applied to the memory gate electrode Ga (Gb) and the word line WL1. The rectifier elements 3a (3b) thus blocks the application of voltage from the memory gate electrode Ga (Gb) to the word line WL1. Hence, the conventional switch transistor that selectively applies voltages to the respective capacitors and the conventional switch control circuit that allows the switch transistor to turn on or off are not necessary, so that miniaturization is achieved correspondingly.

In the anti-fuse memories 37a, 37b, 37c, and 37d according to the third embodiment, both of the memory gate insulating films 6a and 6b of the pair of the memory capacitors 4a and 4b are broken down to program data. In a case where the insulation failure occurred in the memory gate insulating film 6a of the memory capacitor 4a at the time of reading data, the data is identified because the data has been programmed into the memory capacitor 4b. Thus, the same effects as those described in the second embodiment are achieved.

In the anti-fuse memories 37a, 37b, 37c, and 37d, the respective rectifier elements 3a and 3b are separately provided for the memory capacitors 4a and 4b, and the memory capacitors 4a and 4b are electrically insulated from each other. Hence, the electrical connection between the bit lines BL1 and BL2 through the memory capacitors 4a and 4b is prevented even when the memory gate insulating films 6a and 6b of the memory capacitors 4a and 4b are broken down.

Figure 8:
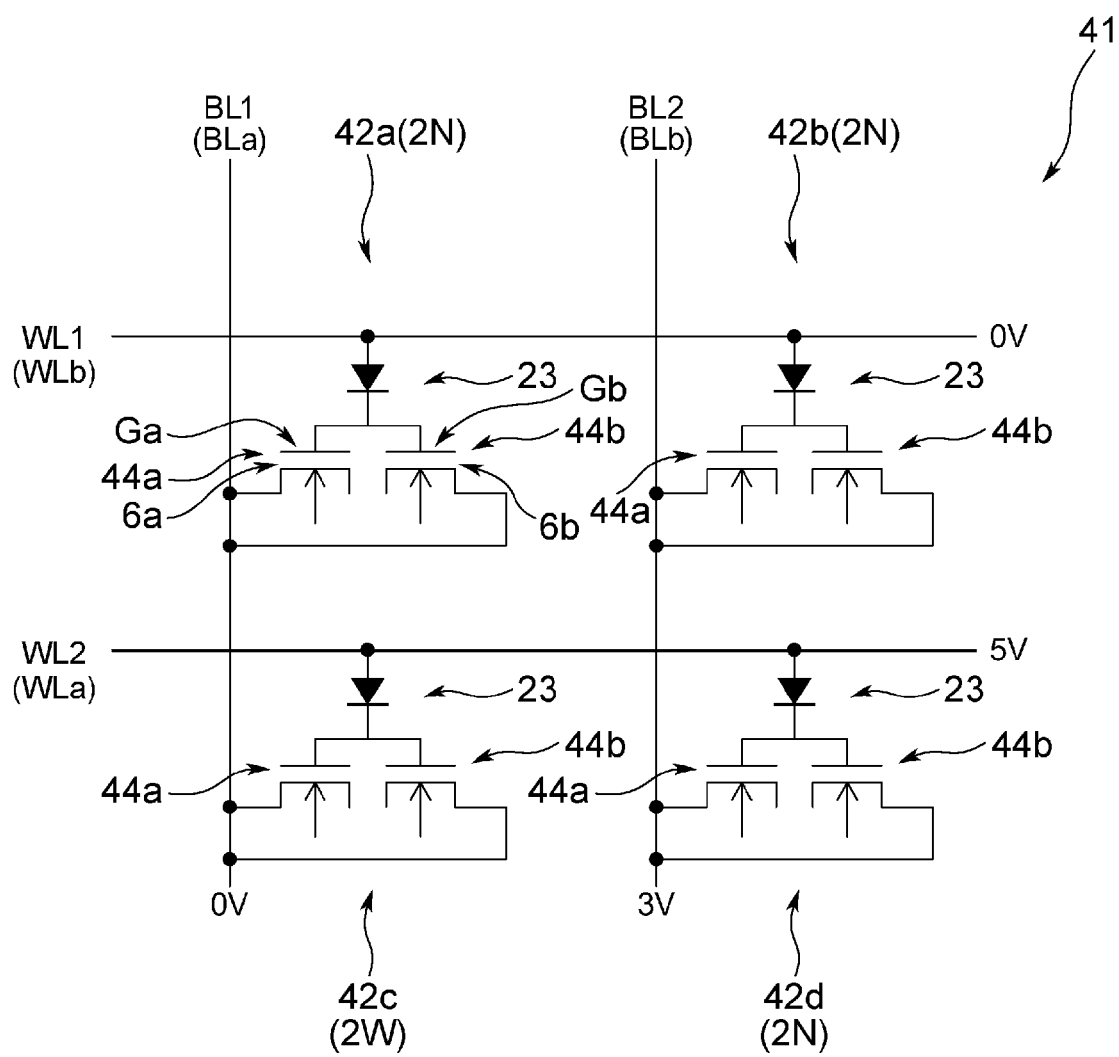
FIG. 8 is a schematic view showing a circuit configuration of a semiconductor memory device including an anti-fuse memory according to a fourth embodiment and voltages at respective sites at the time of data programming operation.

(4) Fourth Embodiment (4-1) Configuration of Semiconductor Memory Device According to Fourth Embodiment In FIG. 8, in which the same reference numerals denote the corresponding parts in FIG. 5, shows a semiconductor memory device 41 according to a fourth embodiment. Similar to the semiconductor memory device 21 according to the second embodiment, the semiconductor memory device 41 includes the anti-fuse memories 42a, 42b, 42c, and 42d, in each of which the memory capacitors 44a and 44b share one rectifier element 23. The semiconductor memory device 41 is different from the semiconductor memory device 21 of the second embodiment in that in each of the anti-fuse memories 42a, 42b, 42c, and 42d of the semiconductor memory device 41, the memory capacitors 44a and 44b share one bit line BL1 (BL2).

Hence, the number of the bit lines in the semiconductor memory device 41 is reduced, as compared with that in the semiconductor memory device 21 of the second embodiment, so that the circuit configuration of the semiconductor memory device 41 is simplified correspondingly. In the semiconductor memory device 41, the anti-fuse memories 42a and 42b(42c and 42d), which are arranged in the row direction, share the word line WL1 (WL2), and the anti-fuse memories 42a and 42c (42b and 42d), which are arranged in the column direction, share the bit line BL1(BL2).

The anti-fuse memories 42a, 42b, 42c, and 42d have the same configuration. For example, the anti-fuse memory 42a, which is disposed at the intersection of the first row and the first column, includes the rectifier element 23, the memory capacitor 44a, and the memory capacitor 44b. The rectifier element 23 includes a PN junction diode type semiconductor junction structure and performs rectification. The memory capacitor 44a includes the memory gate insulating film 6a. The dielectric breakdown of the memory gate insulating film 6a is caused by a voltage difference between the word line WL1 and the bit line BL1. The memory capacitor 44b includes the memory gate insulating film 6b. The dielectric breakdown of the memory gate insulating film 6b is caused by a voltage difference between the word line WL1 and the bit line BL1.

In this embodiment, the rectifier element 23 includes the P-type semiconductor region and the N-type semiconductor region, which are joined to each other. The P-type semiconductor region is connected to the word line WL1. The N-type semiconductor region is connected to the respective memory gate electrodes Ga and Gb of the memory capacitors 44a and 44b. Hence, for example, in the anti-fuse memory 42a, the same voltage is applied from the word line WL1 through the rectifier element 23 to the memory gate electrodes Ga and Gb, while the voltage from the memory gate electrodes Ga and Gb to the word line WL1 is a reverse bias in the rectifier element 23. Thus, the rectifier element 23 blocks the voltage applied from the memory gate electrodes Ga and Gb to the word line WL1.

In the anti-fuse memory 42a, the diffusion region at an end of the memory capacitor 44a and the diffusion region at an end of the memory capacitor 44b are connected to the same bit line BL1. Hence, the same voltage is applied to the memory capacitors 44a and 44b from the bit line BL1.

In the anti-fuse memory 42a, the voltage applied to the word line WL1 is applied through the rectifier element 23 to the respective memory gate electrodes Ga and Gb of the memory capacitors 44a and 44b. This causes a large voltage difference between the bit line BL1 and each of the memory gate electrodes Ga and Gb. The dielectric breakdown of the respective memory gate insulating films 6a and 6b of the memory capacitors 44a and 44b is caused by the large voltage difference, and thus the same data is programmed simultaneously into the memory capacitors 44a and 44b.

(4-2) Data Programming Operation

Data may be programmed only into, for example, the anti-fuse memory 42c of the semiconductor memory device 41 of the fourth embodiment by following the above-described "(2-2-1) Simultaneously programming the same data into a plurality of memory capacitors". As shown in FIG. 8, in a case where data is programmed only into the memory capacitors 44a and 44b of the anti-fuse memory 42c disposed at the intersection of the second row and the first column in the semiconductor memory device 41, a breakdown bit voltage of 0 V is applied to the bit line BL1 (the selected programming bit line BLa) connected to the anti-fuse memory 42c (the selected program memory 2W), to which data is to be programmed. A nonbreakdown bit voltage of 3 V is applied to the bit line BL2 (the nonselected programming bit line BLb) connected only to the anti-fuse memories 42b and 42d, to which data is not to be programmed.

At this time, in the semiconductor memory device 41a, a breakdown word voltage of 5 V is applied to the word line WL2 (the selected programming word line WLa) connected to the selected program memory 2W. A nonbreakdown word voltage of 0 V is applied to the word line WL2 (the nonselected programming word line WLb) connected only to the anti-fuse memories 42a and 42b (nonselected program memory 2N), to which data is not to be programmed.

For example, given that the built-in potential is 0.7 V, and the breakdown word voltage is applied through the rectifier element 23 to the respective memory gate electrodes Ga and Gb of the memory capacitors 44a and 44b in the selected program memory 2W. Due to the breakdown bit voltage and the breakdown word voltage, a voltage difference of 4.3 V occurs between the diffusion regions, to which the selected programming bit line BLa is connected, and the respective memory gate electrodes Ga and Gb. Hence, in the selected program memory 2W, the memory gate insulators 6a and 6b below the memory gate electrodes Ga and Gb of the memory capacitors 44a and 44b break down, respectively. Thereby the diffusion regions and the respective memory gate electrodes Ga and Gb become conductive state, with a low resistance. Thus, the selected program memory 2W achieves a state in which the same data has been programmed into the memory capacitors 44a and 44b.

In the anti-fuse memory 42b, to which the nonbreakdown bit voltage of 3 V is applied from the nonselected programming bit line BLb, a channel is not formed in the memory capacitors 44a and 44b and the memory capacitors 44a and 44b block the nonbreakdown bit voltage of 3 V applied from the nonselected programming bit line BLb because the nonbreakdown word voltage of 0 V is applied to the nonselected programming word line WLb even when, for example, the memory gate insulating films 6a and 6b of the memory capacitors 44a and 44b have been broken down. Hence, the nonbreakdown bit voltage is not applied through the memory gate insulating films 6a and 6b, which have been broken down, to the memory gate electrodes Ga and Gb.

However, in a case where the positions of the dielectric breakdown of the memory gate insulating films 6a and 6b are extremely close to the diffusion regions connected to, for example, the nonselected programming bit line BLb, the channels of the memory capacitors 44a and 44b cannot block the potential of the nonselected programming bit line BLb, so that the nonbreakdown bit voltage of 3 V applied to the diffusion regions may be applied to the memory gate electrodes Ga and Gb.

In the anti-fuse memory 42b, the rectifier element 23 is disposed between the word line WL1 and the memory gate electrodes Ga and Gb of the memory capacitors 44a and 44b. The rectifier element 23 performs rectification through a semiconductor junction structure of the N-type semiconductor region and the P-type semiconductor region. Hence, in a case where the nonbreakdown bit voltage is applied from each of the memory gate electrodes Ga and Gb to the rectifier element 23, the nonbreakdown bit voltage is a reverse bias in the rectifier element 23. Thus, the rectifier element 23 prevents the voltage from being applied to the word line WL1.

The descriptions for the anti-fuse memories 42a, 42b, and 42d, into which data is not to be programmed, are omitted to avoid the repetition of the above-described "(2-2-1) Simultaneously programming the same data into a plurality of memory capacitors".

Data of a desired memory, the anti-fuse memory 42c, of the semiconductor memory device 41 of the fourth embodiment is read by following the above-described "(2-3) Data reading operation", and the descriptions thereof are omitted.

(4-3) Operations and Effects

For example, in the anti-fuse memory 42b, to which data is not to be programmed, even when the dielectric breakdown of the memory gate insulating film 6a (6b) occurred at a position extremely close to the diffusion region connected to, for example, the nonselected programming bit line BLb, and the channel of the memory capacitor 44a (44b) may not block the potential of the nonselected programming bit line BLb, and the nonbreakdown bit voltage is applied from the nonselected programming bit line BLb to the memory gate electrode Ga (Gb) of the memory capacitor 44a (44b), the nonbreakdown bit voltage is a reverse bias in the rectifier element 23. Thus, the rectifier element 23 reliably blocks the voltage applied from the memory gate electrode Ga (Gb) to the word line WL1.

Similar to the first embodiment, the anti-fuse memory 42b is provided with the rectifier element 23, without the use of the conventional control circuit. The rectifier element 23 includes semiconductor junction structure, in which a voltage from the memory gate electrodes Ga and Gb to the word line WL1 is applied as a reverse bias, in accordance with the voltage values applied from the memory gate electrodes Ga and Gb and the word line WL1. Hence, the rectifier element 23 reliably blocks the voltage applied from the memory gate electrodes Ga and Gb to the word line WL1. The conventional switch transistor that selectively applies a voltage to each memory capacitor and the conventional switch control circuit that allows the switch transistor to turn on or off are not necessary. Thus, miniaturization is achieved correspondingly.

In order to program data in the anti-fuse memory 42c according to fourth embodiment, the dielectric breakdown of both of the memory gate insulating films 6a and 6b of the memory capacitors 44a and 44b is caused. In a case where the insulation failure occurred in, for example, the memory gate insulating film 6a of the memory capacitor 4a at the time of reading data, the data is identified because the data has been programmed into the memory capacitor 4b. Thus, the same effects as those described in the second embodiment are achieved.

For example, in the anti-fuse memory 42a, the memory capacitors 44a and 44b share one bit line BL1. Hence the number of bit lines is reduced as compared with the case where the bit lines are provided for the respective memory capacitors 44a and 44b. The circuit configuration is simplified correspondingly.

In the fourth embodiment described above, the anti-fuse memory 42a is used, in which one rectifier element 23 is provided for the memory capacitors 44a and 44b, and the memory capacitors 44a and 44b share the bit line BL1. The present invention is not limited to this. An anti-fuse memory in which the rectifier element 23 is provided for each of the memory capacitors 44a and 44b may be used. The memory capacitors 44a and 44b may share the bit line BL1.

(5) Fifth Embodiment (5-1) Antifuse Memory Including Rectifier Element Including N Type MOS (Metal-Oxide-Semiconductor) Transistor In the above-described first to fourth embodiments, the rectifier elements 3, 11a, 11b, 16a, 16b, 23, 30, 3a, and 3b are described each including a diode-type semiconductor junction structure, which includes the P-type semiconductor region and the N-type semiconductor region and blocks the voltage, which is a reverse bias, from the memory gate electrode. The present invention is not limited to this. For example, a rectifier element may include a MOS transistor type semiconductor junction structure, which includes a rectifier element gate electrode, a drain region, and a source region and blocks the voltage, which is a reverse bias, from the memory gate electrode of the memory capacitor.

Figure 9A:
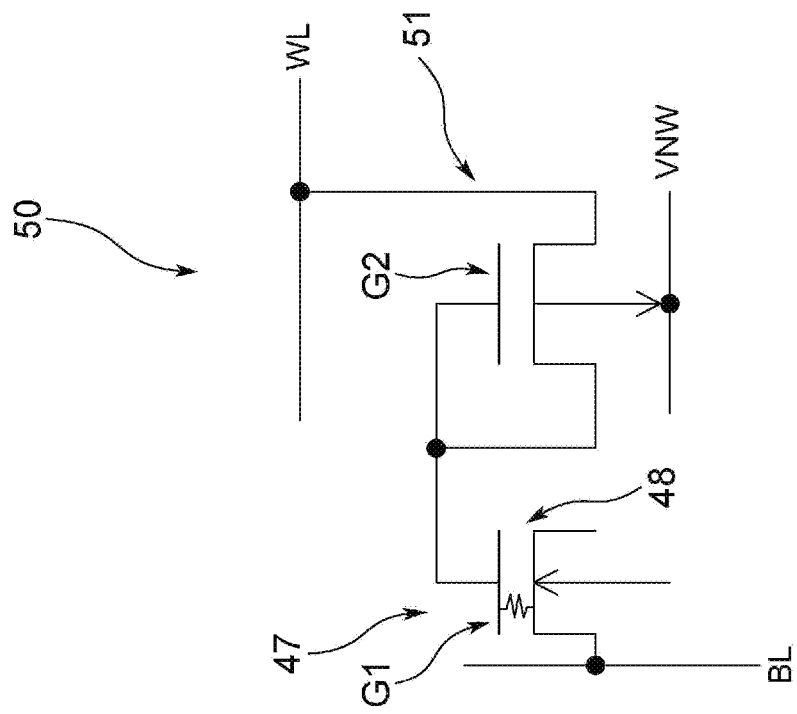
FIG. 9A is a schematic view showing a circuit configuration of an anti-fuse memory according to another embodiment, the anti-fuse memory including a rectifier element including an N-type MOS transistor.

FIG. 9A shows an anti-fuse memory 45 including a rectifier element 46 and a memory capacitor 47. The rectifier element 46 includes a semiconductor junction structure of an N-type MOS transistor. The memory capacitor 47 includes a memory gate insulating film 48. The dielectric breakdown of the memory gate insulating film 48 is caused by a voltage difference between the word line WL and the bit line BL. In the memory capacitor 47, a bit line BL is connected to the diffusion region at one end, and the rectifier element 46 is connected to the memory gate electrode G1. In the rectifier element 46, the rectifier element gate electrode G2 and the drain region are connected to the word line WL, and the source region is connected to the memory gate electrode G1 of the memory capacitor 47. Hence, the transistor of the rectifier element 46 turns off as long as the OFF voltage is applied from the word line WL, and thus the rectifier element 46 blocks the voltage applied from the memory gate electrode G1 to the word line WL.

In the anti-fuse memory 45 including the rectifier element 46, which includes the above-described MOS transistor structure, the rectifier element gate electrode G2 of the rectifier element 46 and the memory gate electrode G1 of the memory capacitor 47 are disposed within one wiring layer (the same layer). The thickness of the rectifier element gate electrode G2 is the same as that of the memory gate electrode G1 of the memory capacitor 47. Thereby, the overall thickness of the anti-fuse memory 45 is reduced.

(5-2) Data Programming Operation

Similar to the semiconductor memory device 1 shown in FIG. 1, in order to program data only into the desired anti-fuse memory 45 among the anti-fuse memories 45 arranged in a matrix of rows and columns, the breakdown bit voltage of 0 V is applied to the bit line BL connected to the anti-fuse memory 45 to which data is to be programmed. The nonbreakdown bit voltage of 3 V is applied to the bit line BL connected only to the anti-fuse memory 45 to which data is not to be programmed.

At this time, the breakdown word voltage of 5 V is applied to the word line WL connected to the anti-fuse memory 45 to which data is to be programmed. The nonbreakdown word voltage of 0 V is applied to the word line WL connected only to the anti-fuse memory 45 to which data is not to be programmed. A voltage of 0 V, which is the same as the breakdown bit voltage, is applied to the well, on which the anti-fuse memory 45 is disposed.

Hence, for example, in the anti-fuse memory 45 into which data is to be programmed, the breakdown bit voltage of 0 V is applied to the bit line BL, and the breakdown word voltage of 5 V is applied to the word line WL. At this time, the breakdown word voltage of 5 V is applied from the word line WL to the rectifier element gate electrode G2 of the rectifier element 46, so that the rectifier element 46 is turned on by the voltage difference between the rectifier element gate electrode G2 and the source region. Thereby a forward bias voltage is applied from the drain region to the source region. The breakdown word voltage lowered by the value of the threshold voltage (Vth) is applied through the drain region and the source region to the memory gate electrode G1 of the memory capacitor 47. At this time, the memory capacitor 47 is turned on due to the relationship between the breakdown word voltage applied to the memory gate electrode G1 and the breakdown bit voltage applied to the bit line BL. Thereby a channel is formed, and the potential of the bit line BL is applied to the channel.

Thereby, a voltage difference between the breakdown bit voltage and the breakdown word voltage is caused between the memory gate electrode G1 and the channel in the memory capacitor 47. Hence, in the memory capacitor 47 of the anti-fuse memory 45 into which data is to be programmed, the dielectric breakdown of the memory gate electrode 48, which is disposed below the memory gate electrode G1, occurs. The memory gate electrode G1 and the diffusion region become conductive state with a low resistance. Thus, a state in which data has been programmed into the memory capacitor 47 is achieved.

In the anti-fuse memory 45 to which data is not to be programmed, the nonbreakdown bit voltage of 3 V is applied to the bit line BL while the nonbreakdown word voltage of 0 V is applied to the word line WL. For example, in a case where the memory gate insulating film 48 of the memory capacitor 47 has been broken down, the nonbreakdown bit voltage of 3 V applied to the bit line BL is applied through the memory gate electrode G1 of the memory capacitor 47 to the source region of the rectifier element 46. At this time, in the anti-fuse memory 45, the nonbreakdown word voltage of 0 V is applied to the word line WL. Hence, 0 V is applied to the rectifier element gate electrode G2 and the drain in the rectifier element 46, and the rectifier element 46 is turned off (becomes non-conductive state). Thereby, even when the nonbreakdown bit voltage of 3 V is applied to the source of the anti-fuse memory 45, the rectifier element 46 blocks the potential. Thus, the nonbreakdown bit voltage is prevented from being applied to the word line WL.

In the anti-fuse memory 45 to which data is not to be programmed and to which the breakdown word voltage of 5 V is applied from the word line WL and the nonbreakdown bit voltage of 3 V is applied from the bit line BL, the breakdown word voltage which is lowered by the value of the threshold voltage is applied from the rectifier element 46 to the memory gate electrode G1 of the memory capacitor 47. However, a voltage difference between the memory gate electrode G1, and the channel and the diffusion region is small. In a case where the memory gate insulating film 48 has not been broken down in the memory capacitor 4, the memory gate insulating film 48 remains insulated. Thus, a state in which no data has been programmed is maintained.

In a semiconductor memory device in which the anti-fuse memories 45 are arranged in the matrix of rows and columns, data is read from the desired anti-fuse memory 45 by following "(1-3) Data reading operation" described above. Hence descriptions thereof are omitted.

(5-3) Operations and Effects

Similar to the above, when a high nonbreakdown bit voltage is applied to the bit line BL connected to the memory capacitor 47 in the anti-fuse memory 45 into which data is not to be programmed, the nonbreakdown bit voltage applied from the memory gate electrode G1 of the memory capacitor 47 to the word line WL is blocked by turning the channel of the rectifier element 46 off (non-conductive state) even in a case where the memory gate insulating film 48 of the memory capacitor 47 has been broken down.

Similar to the first embodiment, the anti-fuse memory 45 is provided with the rectifier element 46, without the use of the conventional control circuit. The rectifier element 46 includes a transistor structure in which the voltage applied from the memory gate electrode G1 to the word line WL is blocked by an off operation. Therefore the conventional switch transistor that selectively applies a voltage to each memory capacitor 47 and the conventional switch control circuit that allows the switch transistor to turn on or off are not necessary. Thus, miniaturization is achieved correspondingly.

Figure 9B:
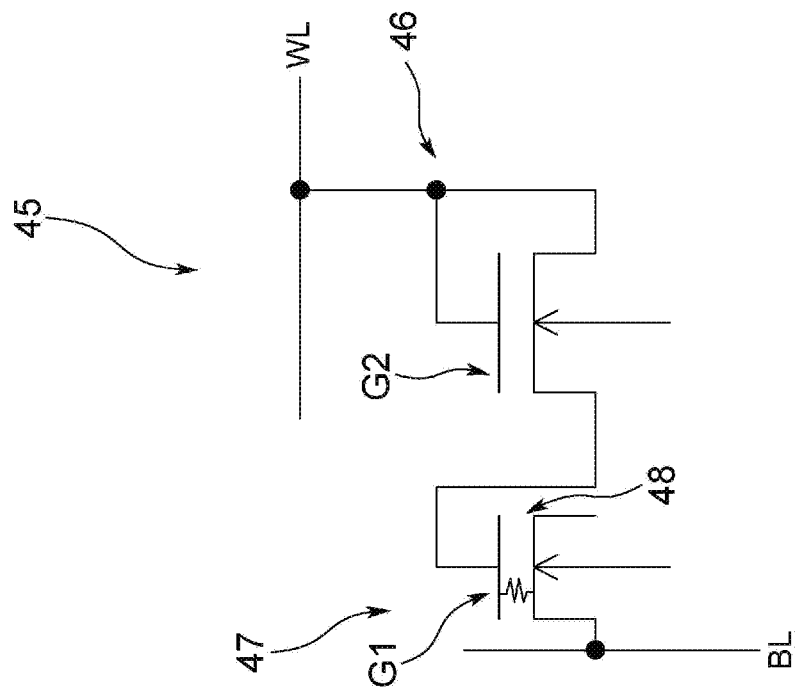
FIG. 9B is a schematic view showing a circuit configuration of an anti-fuse memory according to another embodiment, the anti-fuse memory including a rectifier element including a P-type MOS transistor.

(6) Sixth Embodiment (6-1) Antifuse Memory Including Rectifier Element Including P-Type MOS Transistor In the above fifth embodiment, the anti-fuse memory 45 provided with rectifier element 46 including an N-type MOS transistor has been described, but the present invention is not limited to this. As illustrated in FIG. 9B, an anti-fuse memory 50 provided with a rectifier element 51 including a P-type MOS transistor may be used. In this case, the anti-fuse memory 50 includes the rectifier element 51 and the memory capacitor 47. The rectifier element 51 includes a semiconductor junction structure of a P-type MOS transistor. The memory capacitor 47 includes the memory gate insulating film 48. The dielectric breakdown of the memory gate insulating film 48 is caused by a voltage difference between the bit line BL and the memory gate electrode G1.

In the memory capacitor 47, the bit line BL is connected to the diffusion region, and the rectifier element 51 is connected to the memory gate electrode G1. The rectifier element 51 includes a configuration in which the rectifier element gate electrode G2 and the drain region are connected to the memory gate electrode G1 of the memory capacitor 47, and a well is connected to a well control terminal VNW, and the source region is connected to the word line WL. Hence, the rectifier element 51 remains off unless an ON voltage is applied from the word line WL, and thus blocks the voltage applied from the memory gate electrode G1 to the word line WL.

In the anti-fuse memory 50 including the rectifier element 51, which includes the MOS transistor structure, the rectifier element gate electrode G2 of the rectifier element 51 and the memory gate electrode G1 of the memory capacitor 47 are disposed within one wiring layer (the same layer). The thickness of the rectifier element gate electrode G2 is the same as the thickness of the memory gate electrode G1 of the memory capacitor 47. Hence, the overall thickness of the anti-fuse memory 50 is reduced.

At the time of data programming operation in the anti-fuse memory 50, the breakdown word voltage of 5 V is applied to the word line WL, and the breakdown bit voltage of 0 V is applied to the bit line BL. A voltage of 5 V, which is the same as the breakdown word voltage, is applied through the well control terminal VNW to the well on which the rectifier element 51 is disposed. In a case where the potential of the source region of the rectifier element 51 is approximately 0 V, the rectifier element 51 turns on. In a case where the threshold voltage is −0.7 V, the source region is charged to 4.3 V.

Hence, in the memory capacitor 47, the breakdown word voltage of 5 V is applied from the rectifier element 51 to the memory gate electrode G1. Since 0 V is applied to the bit line, the memory capacitor 47 is turned on. The channel potential becomes 0 V. As a result, a large voltage difference, which is caused by the breakdown bit voltage and the breakdown word voltage, occurs between the memory gate electrode G1 and each of the channel and the diffusion region in the memory capacitor 47. Thereby dielectric breakdown of the memory gate insulating film 48, which is disposed below the memory gate electrode G1, occurs in the memory capacitor 47 of the anti-fuse memory 50 to which data is to be programmed. The memory gate electrode G1 and the diffusion region become conductive state with a low resistance. Thus, a state in which data has been programmed into the memory capacitor 47 is achieved.

Similar to the "(5-2) Data programming operation" described above, the nonbreakdown bit voltage of 3 V is applied to the bit line BL and the nonbreakdown word voltage of 0 V is applied to the word line WL in the anti-fuse memory 50 into which data is not to be programmed. For example, in a case where the memory gate insulating film 48 of, for example, the memory capacitor 47 has been broken down, the nonbreakdown bit voltage of 3 V applied to the bit line BL is applied through the memory gate electrode G1 of the memory capacitor 47 to the source region of the rectifier element 51. However, since the rectifier element 51 has been turned off, the nonbreakdown bit voltage of 3 V applied to the bit line is prevented from being applied to the word line WL. Thus, the potential of the word line WL does not change.

In the anti-fuse memory 50 into which data is not to be programmed and in which the breakdown word voltage of 5V is applied to the word line WL and the nonbreakdown bit voltage of 3 V is applied to the bit line BL, a voltage difference between the memory gate electrode G1 and the diffusion region is small in the memory capacitor 47. Hence, in a case where the memory gate insulating film 48 has not been broken down in the memory capacitor 47, the dielectric breakdown of the memory gate insulating film 48 does not occur and the memory gate insulating film 48 remains insulated. Thus, the anti-fuse memory 50 into which data is not to be programmed maintains a state in which no data has been programmed.

In the semiconductor memory device, in which the anti-fuse memories 50 are arranged in a matrix of rows and columns, data of the desired anti-fuse memory 50 is read by following "(1-3) Data reading operation" described above, so that the descriptions thereof are omitted.

(6-2) Operations and Effects

As described above, when a high nonbreakdown bit voltage is applied to the bit line BL connected to the memory capacitor 47 in the anti-fuse memory 50, into which data is not to be programmed, and in a case where the memory gate insulating film 48 of, for example, the memory capacitor 47 has been broken down, the channel of the rectifier element 51 is turned off (non-conductive state). Thereby the application of the nonbreakdown bit voltage from the memory gate electrode G1 of the memory capacitor 47 to the word line WL is blocked.

Similar to the first embodiment, the anti-fuse memory 50, into which data is not to be programmed, includes the rectifier element 51, and does not use the conventional control circuit. The rectifier element 51 includes a transistor structure and blocks the voltage applied from the memory gate electrode G1 to the word line WL when the rectifier element 51 is turned off in accordance with the voltage values applied to the memory gate electrode G1 and the word line WL. Hence, a switch transistor that selectively applies a voltage to each memory capacitor 47 and a switch control circuit that turns the switch transistor on or off are not necessary. Thus the miniaturization is achieved correspondingly.

Figure 10:
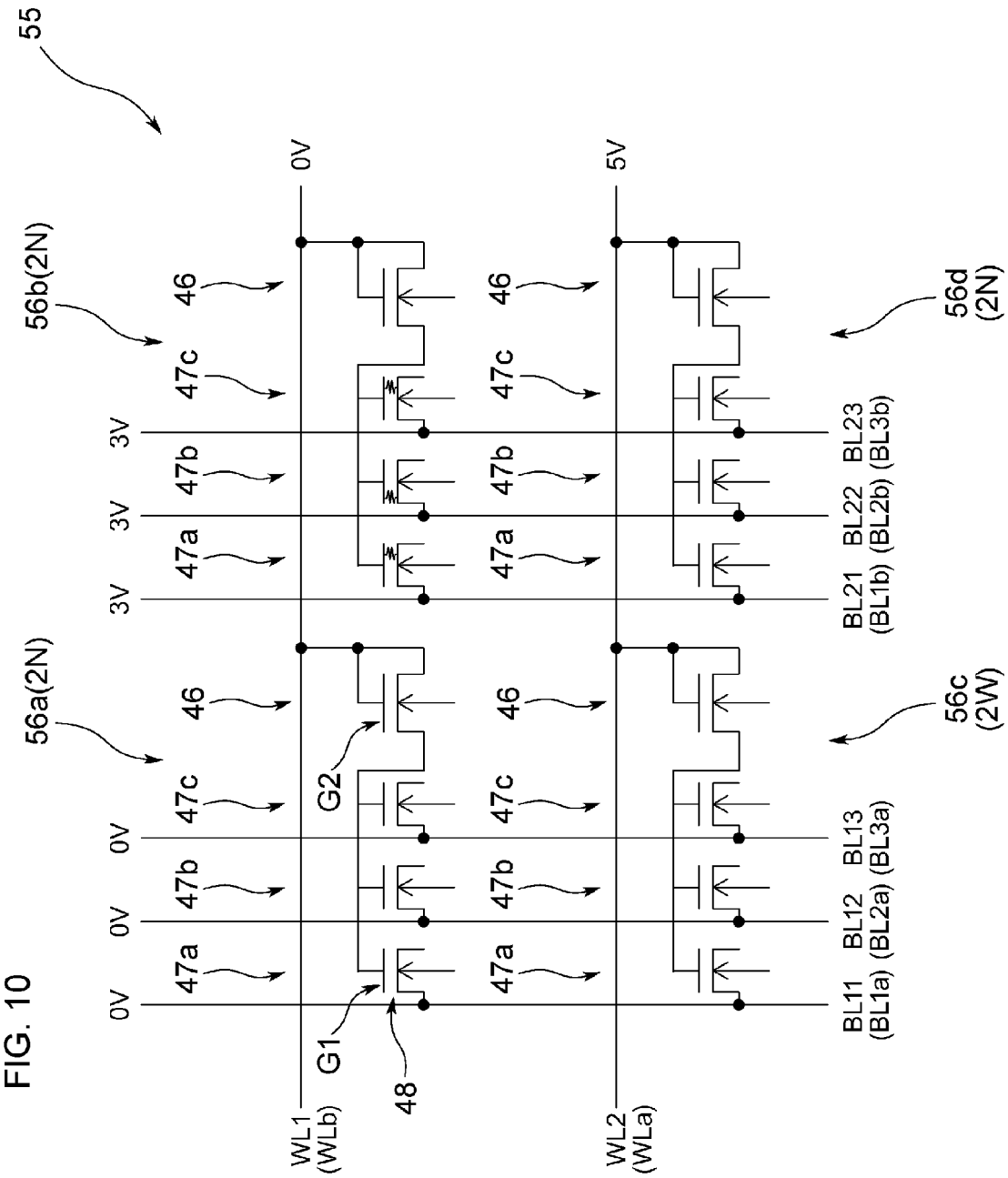
FIG. 10 is a schematic view showing a circuit configuration of an anti-fuse memory in which a plurality of memory capacitors are connected to one rectifier element including the N-type MOS transistor.

(7) Other Embodiments (7-1) Antifuse Memory Including Memory Capacitors and Rectifier Element Including N-Type MOS Transistor FIG. 10 shows a semiconductor memory device 55, in which the anti-fuse memories 56a, 56b, 56c, and 56d are arranged in a matrix of rows and columns. Here, the anti-fuse memories 56a, 56b, 56c, and 56d have the same configuration. For example, the anti-fuse memory 56a disposed at the intersection of the first row and the first column has a configuration in which the memory capacitors 47a, 47b, and 47c are connected to the rectifier element 46, which includes an N-type MOS transistor. The semiconductor memory device 55 is capable of storing data of one bit in each of the anti-fuse memories 56a, 56b, 56c, and 56d. Each of the anti-fuse memories 56a, 56b, 56c, and 56d, is capable of storing the same data in the memory capacitors 47a, 47b, and 47c.

In this case, in the semiconductor memory device 55, the anti-fuse memories 56a and 56b (56c and 56d), which are arranged next to each other in the row direction share the word line WL1 (WL2), and the anti-fuse memories 56a and 56c (56b and 56d), which are arranged next to each other in the column direction, share the bit lines BL11, BL12, and BL13 (BL21, BL22, and BL23).

In the anti-fuse memory 56a, for example, diffusion regions at one ends of the memory capacitors 47a, 47b, and 47c include the corresponding bit lines BL11, BL12, and BL13, respectively. Here, the memory capacitors 47a, 47b, and 47c have the same configuration. For example, the memory capacitor 47a includes a memory gate insulating film 48. The dielectric breakdown of the memory gate insulting film 48 is caused by the voltage difference between the bit line BL11 and the memory gate electrode G1.

In this embodiment, the memory capacitors 47a, 47b, and 47c share one rectifier element 46. Each memory gate electrode G1 is connected to a source region of the rectifier element 46. In the rectifier element 46, the rectifier element gate electrode G2 and the drain region are connected to the word line WL1. The rectifier element 46 is turned off in accordance with the voltage values applied to the memory gate electrode G1 and the word line WL1. Thereby the voltage applied from the memory gate electrode G1 of each of the memory capacitors 47a, 47b, and 47c to the source region is prevented from being applied to the word line WL1.

In the anti-fuse memories 56a, 56b, 56c, and 56d, the same voltage is applied from the word line WL1 (WL2) through the rectifier element 46 to the memory gate electrode G1 of each of the memory capacitors 47a, 47b, and 47c, while the turned-off rectifier element 46 blocks the voltage applied from the memory gate electrode G1 of each of the memory capacitors 47a, 47b, and 47c to the word line WL1 (WL2).

FIG. 10 shows voltage values at the respective sites in a case where data is simultaneously programmed only into the memory capacitors 47a, 47b, and 47c of the anti-fuse memory 56c, which is disposed at the intersection of the second row and the first column, and data is not programmed into the anti-fuse memories 56a, 56b, and 56d. In this case, in the semiconductor memory device 55, the breakdown bit voltage of 0 V is applied to each of the bit lines BL11, BL12, and BL13 (the selected programming bit line BL1a, BL2a, and BL3a), which are connected to the anti-fuse memory 56c (the selected program memory 2W), into which data is to be programmed. The nonbreakdown bit voltage of 3 V is applied to each of the bit lines BL21, BL22, and BL23 (the nonselected programming bit lines BL1b, BL2b, and BL3b), which are connected only to the anti-fuse memories 56b and 56d (nonselected program memory 2N), into which data is not to be programmed.

At this time, in the semiconductor memory device 55, the breakdown word voltage of 5 V is applied to the word line WL2 (the selected programming word line WLa) connected to the anti-fuse memory 56c, to which data is to be programmed. The nonbreakdown word voltage of 0 V is applied to the word line WL1 (the nonselected programming word line WLb) connected only the anti-fuse memory 56a and 56b (the nonselected program memory 2N), into which data is not to be programmed.

Thereby, in each of the memory capacitors 47a, 47b, and 47c of the anti-fuse memory 56c, into which data is to be programmed, the breakdown word voltage is applied to from the rectifier element 46 to each of the memory gate electrodes G1. A voltage difference, which is caused by the breakdown bit voltage and the breakdown word voltage, occurs between each of the memory gate electrodes G1 and the corresponding diffusion region. Hence, in each of the memory capacitors 47a, 47b, and 47c of the anti-fuse memory 56c, into which data is to be programmed, the dielectric breakdown of the memory gate insulating film 48 occurs. Thereby, the memory gate electrode G1 and the diffusion region become conductive state with a low resistance. Thus, the same data is programmed into each of the memory capacitors 47a, 47b, and 47c.

In the anti-fuse memories 56b and 56d, into which data is not to be programmed and which are connected to the bit lines BL21, BL22, and BL23 (the nonselected programming bit lines BL1b, BL2b, and BL3b), to which the nonbreakdown bit voltage of 3 V is applied, a voltage difference between the diffusion region and the memory gate electrode G1 is small in each of the memory capacitors 47a, 47b, and 47c. In a case where the memory gate insulating film 48 has not been broken down in each of the memory capacitors 47a, 47b, and 47c, the dielectric breakdown of the memory gate insulating film 48 does not occur and the memory gate insulating film 48 remains insulated. Thus, each of the anti-fuse memories 56b and 56d maintains a state in which no data has been programmed.

Even when the memory gate insulating film 48 has been broken down in the anti-fuse memory 56b, into which data is not to be programmed, the nonbreakdown bit voltage is prevented from being applied from the memory gate electrode G1 to the rectifier element 46, by turning off the rectifier element 46 because the rectifier element 46 is disposed between the word line WL1 and each of the memory capacitors 47a, 47b, and 47c.

The semiconductor memory device 55 shown in FIG. 10 is capable of performing data programming operation similar to "(2-2-2) Sequentially programming the same data into a plurality of memory capacitors" described above. The same data is programmed in order into each of the memory capacitors 47a, 47b, and 47c in the predetermined anti-fuse memory 56c.

(7-2) Memory Capacitor Including FinFET (Fin Field Effect Transistor)

Figure 11:
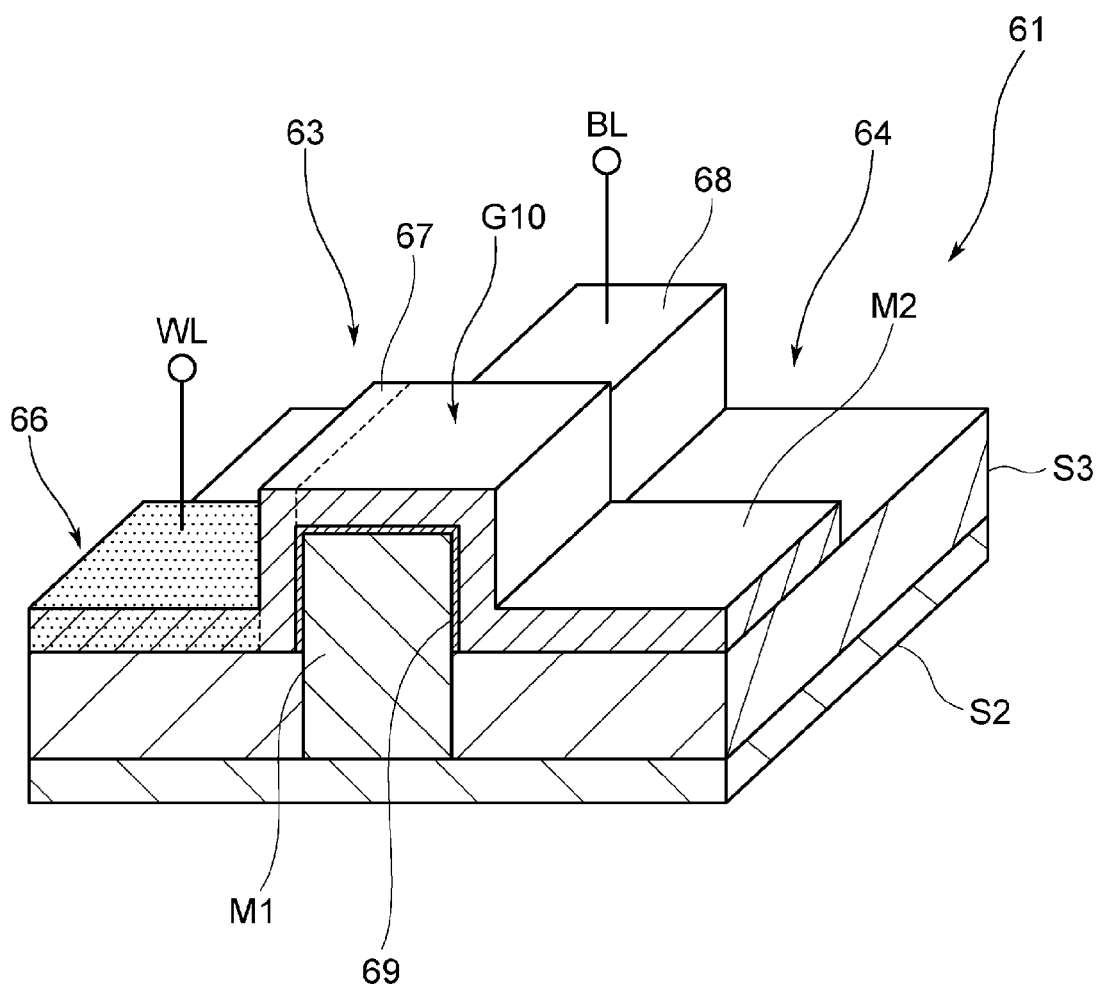
FIG. 11 is a schematic view showing an anti-fuse memory including a memory capacitor including FinFET.

The first to sixth embodiments described the anti-fuse memories 2a, 2b, 2c, 2d, 22a, 22b, 22c, 22d, 37a, 37b, 37c, 37d, 42a, 42b, 42c, 42d, 45, 50, 56a, 56b, 56c, and 56d including the memory capacitors 4, 4a, 4b, 24a, 24b, 44a, 44b, 47, 47a, 47b, or 47c each including a planar type transistor, in which the diffusion region and the channel are disposed in one plane. The present invention is not limited to this. An anti-fuse memory 61 including a memory capacitor 64 including FinFET shown in FIG. 11 may be used.

In this case, in the anti-fuse memory 61, the element isolation layer S3 is disposed on the P-type or N-type well S2. A diffusion region formation section M1 is disposed in a standing manner on the well S2. The diffusion region formation section M1 is made of the well and has a cubic shape. An end portion of the diffusion region formation section M1 is protruded from the surface of the element isolation layer S3. In the anti-fuse memory 61, a belt-shaped rectifier element formation section M2 is disposed on the surface of the element isolation layer S3 such that the rectifier element formation section M2 is orthogonal with the longitudinal direction of the diffusion region formation section M1. A part of the diffusion region formation section M1 protruded from the surface of the element isolation layer S3 is covered by the rectifier element formation section M2.

A diffusion region 68 of the memory capacitor 64 is disposed on a region of the diffusion region formation section M1 not covered by the rectifier element formation section M2. A bit line BL is connected to the diffusion region 68. A memory gate electrode G10 is disposed on a region of the rectifier element formation section M2 covering the diffusion region formation section M1. The memory gate insulating film 69 is disposed between the memory gate electrode G10 and the diffusion region formation section M1.

An N-type semiconductor region 67 of the rectifier element 63 is disposed in a part of a region of the rectifier element formation section M2 covering the diffusion region formation section M1. The rectifier element 63 has a configuration in which the N-type semiconductor region 67 is joined to the memory gate electrode G10. A P-type semiconductor region 66 is disposed on an end of the rectifier element formation section M2 disposed on the surface of the element isolation layer S3 such that the P-type semiconductor region 66 is joined to the N-type semiconductor region 67. Thus, the rectifier element 63 including a PN junction diode is disposed. The P-type semiconductor region 66 of the rectifier element 63 is connected to the word line WL.

In the anti-fuse memory 61, a voltage is applied from the word line WL through the rectifier element 63 to the memory gate electrode G10 of the memory capacitor 64. The voltage from the memory gate electrode G10 to the word line WL is a reverse bias in the rectifier element 63 in accordance with the voltage values applied to the word line WL and the memory gate electrode G10 of the memory capacitor 64. Thereby, the rectifier element 63 blocks the application of voltage from the memory gate electrode G10 to the word line WL. Thus, the anti-fuse memory 61 achieves the same effects as those described in the above embodiments.

(7-3) Others

The present invention is not limited to this embodiment and various modifications are possible within the scope of the present invention. For example, the anti-fuse memory 2a, 2b, 2c, 2d, 22a, 22b, 22c, 22d, 37a, 37b, 37c, 37d, 42a, 42b, 42c, 42d, 45, 50, 56a, 56b, 56c, or 56d according to the first, second, third, fourth, fifth, or sixth embodiment described above and the anti-fuse memory 61 including Fin FET shown in FIG. 11 may be combined as appropriate. In other embodiments, the rectifier element 46 including the N-type transistor shown in FIG. 9A, the rectifier element 51 including the P-type transistor shown in FIG. 9B, or the anti-fuse memory 61 including Fin FET shown in FIG. 11 may be combined with the first, second, third, fourth, fifth, or sixth embodiment. For example, in the anti-fuse memories 56a, 56b, 56c, and 56d shown in FIG. 10, the rectifier element 51 including the P-type transistor may be used instead of the N-type transistor. A separate rectifier element may be disposed for each memory capacitor.

REFERENCE SIGNS LIST 1, 21, 36, 41, 55 semiconductor memory device
2a, 2b, 2c, 2d, 22a, 22b, 22c, 22d, 37a, 37b, 37c, 37d, 42a, 42b, 42c, 42d, 45, 50, 56a, 56b, 56c, 56d, 61 anti-fuse memory
3, 3a, 3b, 11a, 11b, 16a, 16b, 23, 30, 46, 51, 63 rectifier element
4, 4a, 4b, 24a, 24b, 44a, 44b, 47, 47a, 47b, 47c, 64 memory capacitor
G, Ga, Gb, G1 memory gate electrode
6, 6a, 6b, 48 memory gate insulating film
S2 well

The invention claimed is:

1. An anti-fuse memory comprising:
a memory capacitor including a memory gate electrode disposed on a memory gate insulating film, and a diffusion region connected to a bit line and disposed in a well; and
a rectifier element disposed between the memory gate electrode and a word line, the rectifier element including a P-type semiconductor region connected to the word line and including an N-type semiconductor region connected to the memory gate electrode to allow application of a voltage from the word line to the memory gate electrode, and to block application of a voltage from the memory gate electrode to the word line in accordance with a voltage value applied to the memory gate electrode and the word line, the P-type semiconductor region and the N-type semiconductor region of the rectifier element and the memory gate electrode being formed within the same layer.

2. The anti-fuse memory according to claim 1, wherein the voltage applied to the word line is applied through the rectifier element to the memory gate electrode, to cause breakdown of the memory gate insulating film due to a voltage difference between the memory gate electrode and the bit line, so as to program data into the memory capacitor, and
the application of the voltage from the memory gate electrode of the memory capacitor to the word line is blocked in a case where the memory gate electrode has a higher voltage than the word line, so as not to program data into the memory capacitor.

3. The anti-fuse memory according to claim 1, wherein the P-type semiconductor region and the N-type semiconductor region are joined to each other to define a semiconductor junction structure of a PN junction diode.

4. The anti-fuse memory according to claim 1, wherein the rectifier element further includes an intrinsic semiconductor region disposed between the P-type semiconductor region and the N-type semiconductor region to define a semiconductor junction structure of a PIN (P-Intrinsic-N) junction diode.

5. The anti-fuse memory according to claim 3, wherein the P-type semiconductor region and the N-type semiconductor region, which are included in the rectifier element, are formed integrally with the memory gate electrode.

6. The anti-fuse memory according to claim 1,
wherein the rectifier element includes an N-type MOS (Metal-Oxide-Semiconductor) transistor or a P-type MOS transistor, and
a source region is connected to the memory gate electrode, and
a drain region is connected to the word line, and
a rectifier element gate electrode is connected to one of the word line and the memory gate electrode, and
the rectifier element blocks the application of the voltage from the memory gate electrode to the word line by allowing a channel to be in a non-conductive state.

7. The anti-fuse memory according to claim 6, wherein the rectifier element gate electrode of the rectifier element and the memory gate electrode are formed within the same layer.

8. The anti-fuse memory according to claim 1, wherein the memory capacitor includes the memory gate electrode as a first memory gate electrode,
the anti-fuse memory further comprises an additional memory capacitor including a second memory gate electrode,
the first and second memory gate electrodes are connected to the rectifier element.

9. The anti-fuse memory according to claim 8, wherein the memory capacitor is connected to the bit line, and the additional memory capacitor is connected to another bit line.

10. The anti-fuse memory according to claim 8, wherein the memory capacitor and the additional memory capacitor share the bit line.

11. A semiconductor memory device comprising anti-fuse memories, each of the anti-fuse memories being defined as the anti-fuse memory according to claim 1, the anti-fuse memories being respectively disposed at intersections of word lines and bit lines.

12. The semiconductor memory device according to claim 11, wherein the anti-fuse memories include a pair of a first anti-fuse memory and a second anti-fuse memory, and data is programmed into the first anti-fuse memory and then the data is programmed into the second anti-fuse memory, so as to program the same data into the first anti-fuse memory and the second anti-fuse memory.

* * * * *